US008614922B2

(12) United States Patent
Hanzawa

(10) Patent No.: US 8,614,922 B2
(45) Date of Patent: Dec. 24, 2013

(54) SEMICONDUCTOR STORAGE APPARATUS OR SEMICONDUCTOR MEMORY MODULE

(75) Inventor: Satoru Hanzawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 138 days.

(21) Appl. No.: 13/327,585

(22) Filed: Dec. 15, 2011

(65) Prior Publication Data

US 2012/0155162 A1    Jun. 21, 2012

(30) Foreign Application Priority Data

Dec. 16, 2010    (JP) .................................. 2010-280871

(51) Int. Cl.
*G11C 7/00*    (2006.01)

(52) U.S. Cl.
USPC ............ 365/189.05; 365/230.03; 365/230.08; 365/185.22

(58) Field of Classification Search
USPC ................... 265/189.05; 365/230.03, 230.08, 365/185.22
See application file for complete search history.

(56) References Cited

U.S. PATENT DOCUMENTS

| 7,286,394 | B2 * | 10/2007 | Ooishi ........................ 365/158 |
| 7,652,935 | B2 * | 1/2010 | Ogawa et al. ............ 365/189.16 |
| 2006/0203548 | A1 | 9/2006 | You |
| 2009/0168505 | A1 | 7/2009 | Hanzawa et al. |
| 2010/0118592 | A1 | 5/2010 | Ishihara et al. |
| 2011/0242872 | A1 | 10/2011 | Hanzawa |

FOREIGN PATENT DOCUMENTS

| JP | 05-028779 A | 2/1993 |
| JP | 2001-084777 A | 3/2001 |
| JP | 2006-252747 A | 9/2006 |
| JP | 2009-158020 A | 7/2009 |
| JP | 2010-113742 A | 5/2010 |
| JP | 2010-129104 A | 6/2010 |
| WO | WO 2008/032394 A1 | 3/2008 |
| WO | WO 2010/067768 A1 | 6/2010 |

OTHER PUBLICATIONS

Kwang-Jin Lee et al., "A 90nm 1.8V 512Mb Diode-Switch PRAM with 266MB/s Read Throughput" IEEE International Solid-State Circuits Conference, Digest of Technical Papers, 2007, pp. 472-473 and 616.

Stefan Lai et al., "OUM—A 180 nm Nonvolatile Memory Cell Element Technology for Stand Alone and Embedded Applications", International Electron Devices meeting, Technical Digest, 2001, pp. 803-806.

Office Action issued Jul. 23, 2013, in Japanese Patent Application No. 2010-280871.

* cited by examiner

*Primary Examiner* — Son Dinh
(74) *Attorney, Agent, or Firm* — Miles & Stockbridge P.C.

(57) ABSTRACT

A semiconductor storage apparatus provides a large capacity phase-change memory possessing high speed operation, low electrical current, and high-reliability. During the period that a read-out start signal is activated in the memory region control circuit, and the block of pairs of sense-latch and write driver is performing the verify read in the upper section memory region, the write enable signals in the memory region control circuit are activated and the block of pairs of sense-latch and write driver performs rewrite operation of the data in the lower section memory region. This type of operation allows cancelling out the time required for the verify read and the time required for the time-division write operation by performing the verify read in one memory region, while performing time-division rewrite in other memory region, to achieve both higher reliability rewrite operation along with suppressing the rewrite operation peak electrical current.

10 Claims, 14 Drawing Sheets

SEMICONDUCTOR STORAGE APPARATUS OR SEMICONDUCTOR MEMORY MODULE

CLAIM OF PRIORITY

The present application claims priority from Japanese patent application JP 2010-280871 filed on Dec. 16, 2010, the content of which is hereby incorporated by reference into this application.

FIELD OF THE INVENTION

The present invention relates to technology for rewriting data in non-volatile semiconductor memories, and relates in particular to technology effective for storage devices containing memory cells comprised of elements with resistance values that differ according to the stored data.

BACKGROUND OF THE INVENTION

NAND type flash memories are currently exhibiting amazing growth as a memory for holding non-volatile storage of programs and data. NAND type flash memories include features such as large capacity and also high-speed data transfer. To achieve a large capacity memory, a NAND string structure is utilized that improves the memory cell usage rate by reducing the surface area coupled to the bit lines and memory cells. Large capacity was also attained by micro-fabrication technology and multi-bit storage technology.

These efforts resulted in a memory cell array structure featuring a large number of memory cells coupled to one word line. The NAND type flash memory takes advantage of the features of this structure to improve data transfer efficiency by temporarily storing write data in amounts from several hundred bytes to several kilobytes input from an external section into a buffer inside a chip, and then simultaneously writing that data by a memory cell array operation into a memory cell.

On the other hand, minimal fabrication dimensions are currently approaching the 20 nanometer level where problems are predicted to occur such as a drop in memory cell rewrite durability and faulty memory cell array operation, so that micro-fabrication of NAND type flash memories or in other words fabrication of large capacity memories is reaching its limits.

To break through these limits on micro-fabrication, a phase-change memory has been proposed that utilizes diodes and storage layers comprised of chalcogenide material possessing a structure and operating principle different from NAND type flash memories of the related art and serve as the next generation non-volatile memory.

The storage elements in the phase-change memory cell currently under study utilize chalcogenide material (or phase-change material) including at least antimony (Sb) and tellurium (Te) such as Ge(germanium)-Sb—Te alloy, or Ag(silver)-In(indium)-Sb—Te alloy as the material for the storage layers.

This data rewrite operation in the phase-change memory cell, utilizes Joule heating to change the crystalline state of the storage layer according to the stored data. The data readout operation on the other hand applies a fixed voltage to the storage layer to distinguish electrical current signals from one another by their resistance values that vary according to the crystalline state.

The structure and operation characteristics of this type of memory cell are described for example in FIG. 1 through FIG. 3 of non-patent document 1 (see IEEE International Solid-State Circuits Conference, Digest of Technical Papers (USA), 2007, pp. 472-473). Moreover, as described in FIG. 7 of International Electron Devices meeting, TECHNICAL DIGEST (USA), 2001, pp. 803-806, the smaller the phase-change region of the storage layer, the less power is required for the write operation (see International Electron Devices meeting, TECHNICAL DIGEST (USA), 2001, pp. 803-806). Phase-change memories are therefore ideal for continuous micro-fabrication and possess good prospects for serving as next generation non-volatile memories.

Achieving phase-change memories having large storage capacity and also a high data transfer rate requires compensating for irregularities in memory cell rewrite properties. Memory chips can store information in the gigabit class where more than one billion memory cells are fabricated, so compensating for these irregularities is likely to prove to be a necessary condition.

One widely known method for compensating for irregularities repeatedly performs rewrite while adjusting operation conditions according to the rewrite results. The verifying of rewrite operation results is hereafter called the "Verify read".

Though repeating the rewrite operation correctly rewrites all of the data, the overall time required for the rewrite operation is long.

A known method for resolving this problem is to alternately perform the rewrite operation and the verify read-out operation on a set of two memory cells to, in this way, conceal the verify readout time (Japanese Unexamined Patent Application Publication No. 2010-113742 and Japanese Unexamined Patent Application Publication No. 2010-129104).

SUMMARY OF THE INVENTION

The present inventors perceived that this type of technology for rewriting data onto phase-change memories also contained the following problems:

Besides compensating for irregularities in rewrite properties in the above described memory cell, one other requirement for attaining a high-reliability phase-change memory is suppressing the peak value of rewrite current that is the operation current in the phase-change memory.

In the phase-change memory, a specified electrical current must be applied to the selected memory cell in order to generate the Joule heat required to cause a phase-change in the chalcogenide material. This electrical current value is on a widely different scale than for NAND type flash memories and so, during simultaneous writing of several hundred bytes to several kilobytes of data, it exceeds the electrical current drive performance of the system power supply or internal power supply circuit within the memory chip, causing the concern that correcting rewriting the desired information may be impossible.

Therefore, a so-called time-division rewrite operation is required that rewrites information a little at a time while selecting a small quantity of memory cells. However, a time-division rewrite operation has the problem that it increases the overall time for the rewrite operation. The Japanese Unexamined Patent Application Publication No. 2010-113742 and Japanese Unexamined Patent Application Publication No. 2010-129104 described above do not deal with this problem.

In view of the above problems with the related art, the present invention has the object of providing technology for achieving an operation sequence with high rewrite data transfer efficiency and also stable low electrical current operation in a phase-change memory.

The above objects of the present invention, as well as other objects and novel features will become apparent from the description in the specification and from the accompanying drawings.

A brief description of the concept for typical aspects of the present invention disclosed in the specification is given next.

The present invention according to one aspect includes a first and a second memory region; and the applicable first memory region includes a first and a second memory plane, each plane containing multiple memory cells arranged in a matrix; and first and second blocks of pairs of sense-latch and write drivers to write and to read information in the first and the second memory planes; and a first memory region control circuit to respectively generate:

a first write enable signal output to the first block of pairs of sense-latch and write driver, a second write enable signal output to the second block of pairs of sense-latch and write driver, and a first readout start signal output to the first and second blocks of pairs of sense-latch and write driver according to an input internal address and a read/write control signal; and the second memory region includes a third and a fourth memory plane, each plane containing multiple memory cells arranged in a matrix; and a third and a fourth block of pairs of sense-latch and write driver to read and to write information in the third and the fourth memory planes; and a second memory region control circuit to respectively generate:

a third write enable signal output to the third block of pairs of sense-latch and write driver, a fourth write enable signal output to the fourth block of pairs of sense-latch and write driver, and a second readout start signal output to the third and the fourth block of pairs of sense-latch and write driver according to the input internal address, and the read/write control signal; and in which the first readout start signal in the first memory region control circuit is activated, the third and fourth write enable signals in the second memory region control circuit are activated, and the third and fourth blocks of pairs of sense-latch and write driver perform the first and second rewrite operation in the second memory region, in the first period in which the first and second blocks of pairs of sense-latch and write driver are performing the first verify read in the first memory region.

In the present invention the plurality of memory cells include storage layers utilizing chalcogenide material as the storage element.

In the present invention, the plurality of memory cells are further comprised of diodes functioning as the selection element.

The present invention according to another embodiment, includes a second period in which the first and second write enable signals are activated following the first period; and the second readout start signal is activated, and the second verify read is performed in the second memory region in the second period in which the third and fourth rewrite operations are performed in the first memory region.

Other aspects of the concept of these specifications are briefly shown.

The present invention according to still another aspect includes a first and a second memory region; and the applicable first memory region includes a first and a second memory plane, each plane containing multiple memory cells arranged in a matrix; and a first and a second block of pairs of sense-latch and write drivers to write and to read information in the first and the second memory planes; and a first memory region control circuit to respectively generate: a first write enable signal output to the first block of pairs of sense-latch and write drivers, a second write enable signal output to the second block of pairs of sense-latch and write driver, a first readout start signal output to the first block of pairs of sense-latch and write driver, and a second readout start signal output to the second block of pairs of sense-latch and write drivers according to the input internal address and the read/write control signal; and the second memory region includes a third and a fourth memory plane, each plane containing multiple memory cells arranged in a matrix; and a third and a fourth block of pairs of sense-latch and write driver to write and to read information in the third and the fourth memory planes; and a second memory region control circuit to respectively generate:

a third write enable signal output to the third block of pairs of sense-latch and write driver, a fourth write enable signal output to the fourth block of pairs of sense-latch and write driver, a third readout start signal output to the third block of pairs of sense-latch and write driver, and a fourth readout start signal output to the fourth block of pairs of sense-latch and write drivers according to the input internal address, and the read/write control signal; and in which the first block of pairs of sense-latch and write driver performs the first rewrite operation on the first memory plane by activating the first write enable signal, and performs the first verify read on the first memory plane by activating the first readout start signal; the second block of pairs of sense-latch and write driver performs the second rewrite operation on the second memory plane by activating the second write enable signal; and further, performs the second verify read on the second memory plane by activating the second readout start signal; the third block of pairs of sense-latch and write driver performs the third rewrite operation on the third memory plane by activating the third write enable signal, and performs the verify read on the third memory plane by activating the third readout start signal, performs the fourth rewrite operation on the fourth memory plane by activating the fourth write enable signal; and further the fourth block of pairs of sense-latch and write driver performs the fourth verify read on the fourth memory plane by activating the fourth readout start signal; and the third and fourth rewrite operations are performed after the first and the second rewrite operations.

The present invention according to yet another aspect is a semiconductor memory module including multiple memory chips and a control chip to control the operation of the applicable memory chips, and in which, the applicable memory chip is comprised of a first and a second memory region; and the first memory region includes a first and a second memory plane, each containing multiple memory cells arranged in a matrix; and a first and a second block of pairs of sense-latch and write driver to write and to read information in the first and the second memory planes; and a first memory region control circuit to respectively generate:

a first write enable signal output to the first block of pairs of sense-latch and write drivers, a second write enable signal output to the second block of pairs of sense-latch and write driver, and a first readout start signal output to the first and the second block of pairs of sense-latch and write drivers according to an input internal address and a read/write control signal; and the second memory region includes a third and a fourth memory plane, each containing multiple memory cells arranged in a matrix; and a third and a fourth block of pairs of sense-latch and write drivers to write and to read information in the third and the fourth memory planes; and a second memory region control circuit to respectively generate:

a third write enable signal output to the third block of pairs of sense-latch and write driver, a fourth write enable signal output to the fourth block of pairs of sense-latch and write driver, and a second readout start signal output to the third and fourth blocks of pairs of sense-latch and write driver according to the input internal address, and the read/write control signal; and in which the third and the fourth blocks of pairs of sense-latch and write driver perform the first and the second rewrite operation on the second memory region by activating the third and the fourth write enable signals, in the first period in which the first and the second blocks of pairs of sense-latch and write driver perform the first verify read in the first memory region by activating of the first readout start signal in the first memory region control circuit.

Effects obtained by typical aspects of the invention disclosed in the specification are briefly described next.
(1) The data rewrite time can be performed at high-speed.
(2) The peak current can be suppressed during the data rewrite operation.
(3) The effect rendered by (1) and (2) above allows attaining a highly reliable, large storage capacity semiconductor storage apparatus.

DETAILED DESCRIPTION OF THE PREFERRED EMBODIMENTS

Figure 1:
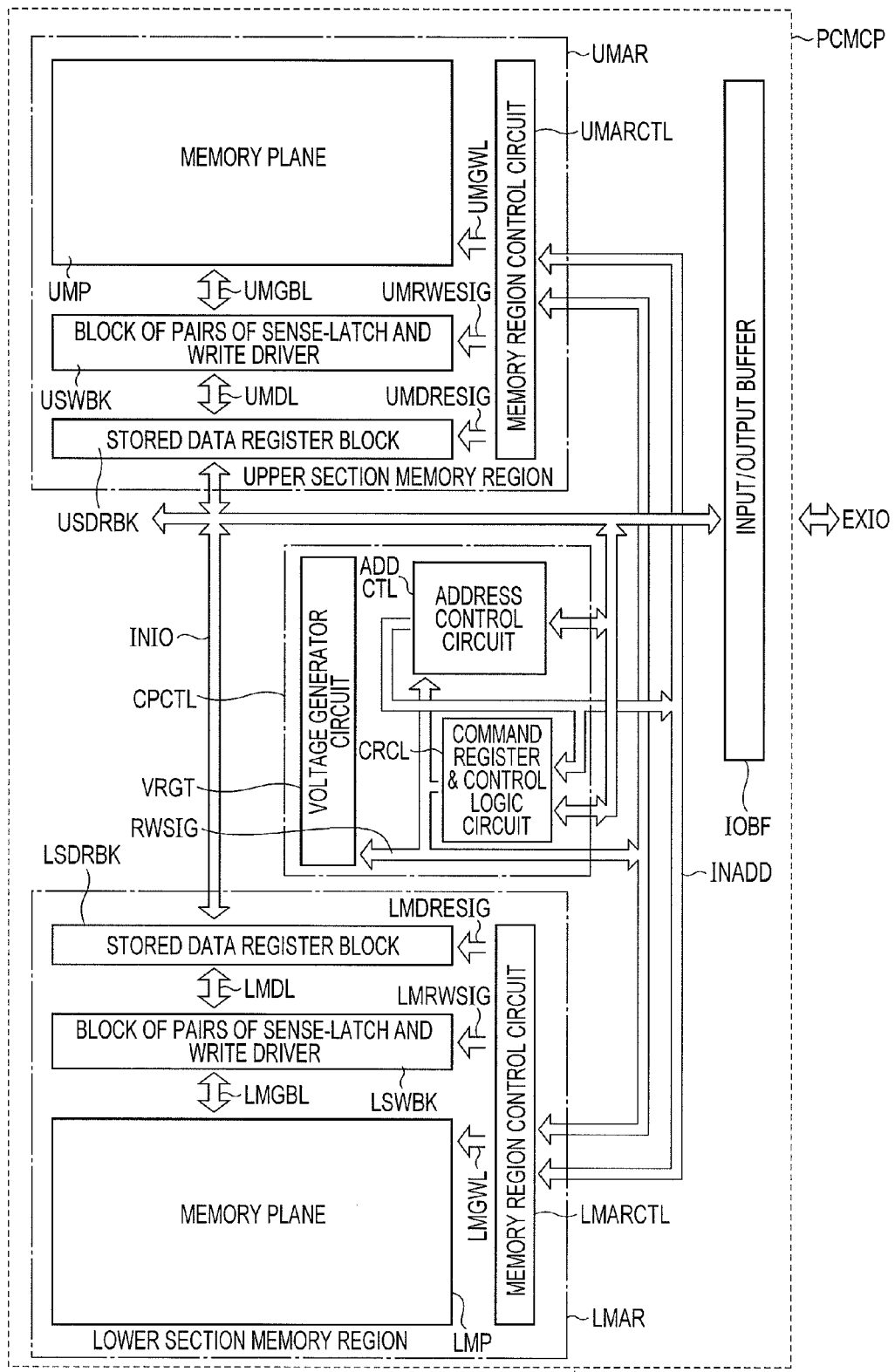
FIG. 1 is a block diagram showing one example of the structure of a circuit section of the phase-change memory chip of the first embodiment of the present invention.

The embodiments of the present invention are described next in detail while referring to the accompanying drawings. In the following description of the embodiments, the same reference numerals are generally assigned to identical members in all drawings and repetitive descriptions are omitted.

Though there are no particular restrictions, the circuits elements contained in each function block of the embodiments are fabricated over a semiconductor circuit substrate such as single crystal silicon by integrated circuit technology of the related art such as CMOS (complementary metal oxide semiconductor transistor). Moreover, the memory cells contained in each of the memory planes of the embodiments are memory cells such as phase-change memories or ReRAM (Resistive Random Access memory) or MRAM (Magnetoresistive Random Access Memory) utilizing for example a phase-changing material of chalcogenide to store the information and discriminate the information by detecting the difference in resistance values and that do not require block erasure.

First Embodiment

Figure 2:
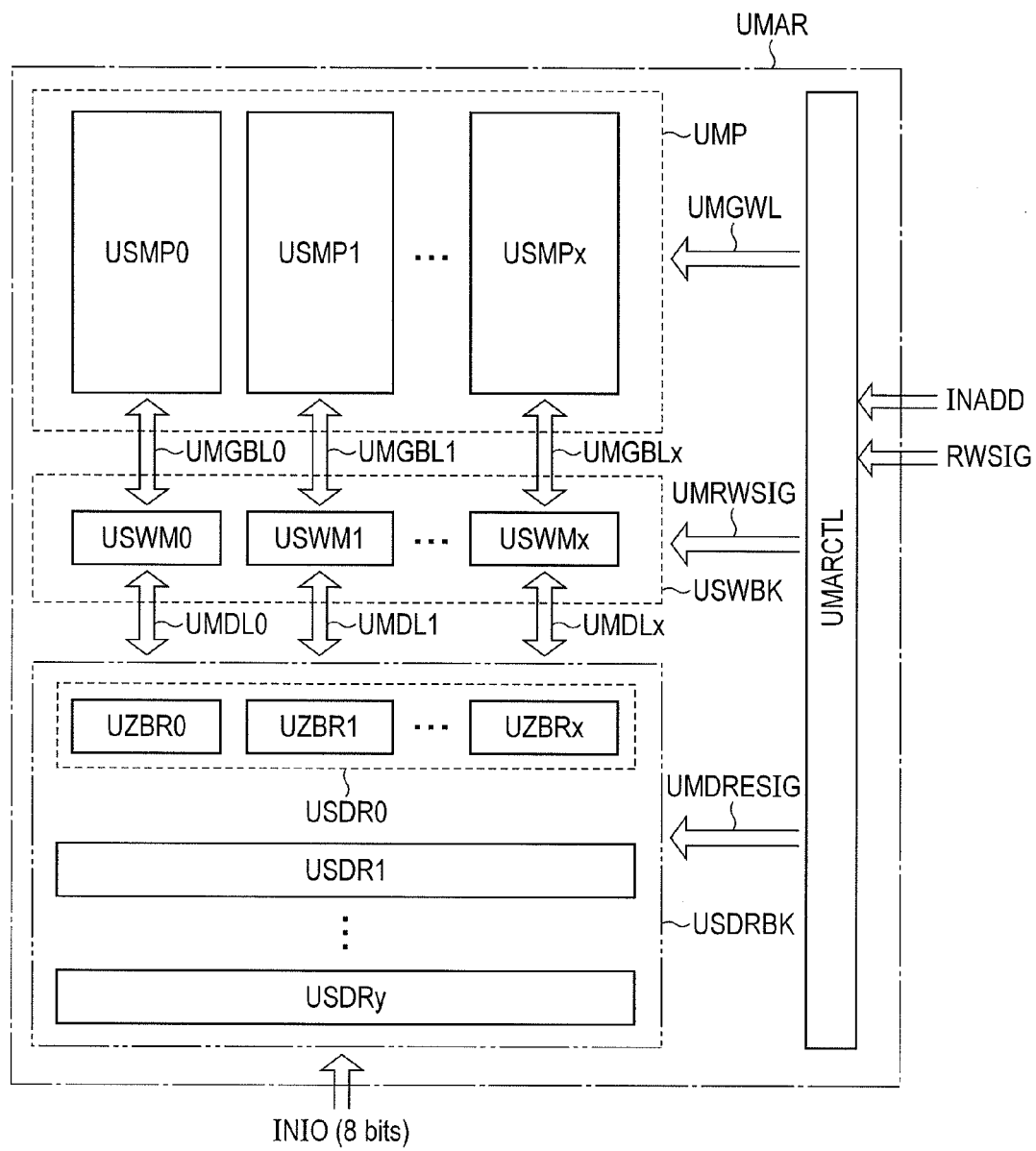
FIG. 2 is a block diagram showing one example of the structure of a circuit section of the upper section memory region on phase-change memory chip in FIG. 1.
Figure 3:
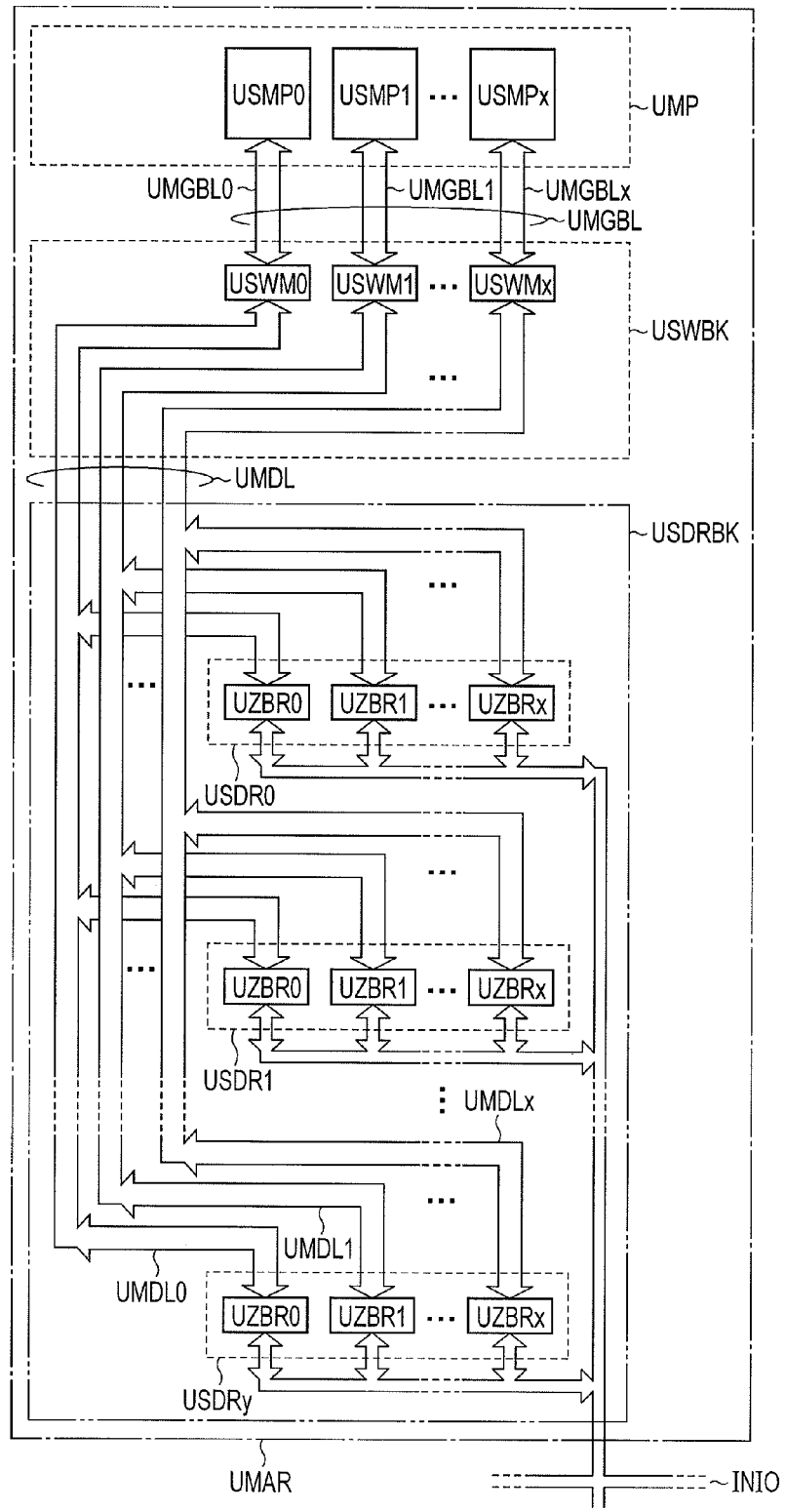
FIG. 3 is a block diagram showing one example of the structure of the wiring coupling the circuit section in the upper section memory region in FIG. 2.
Figure 4:
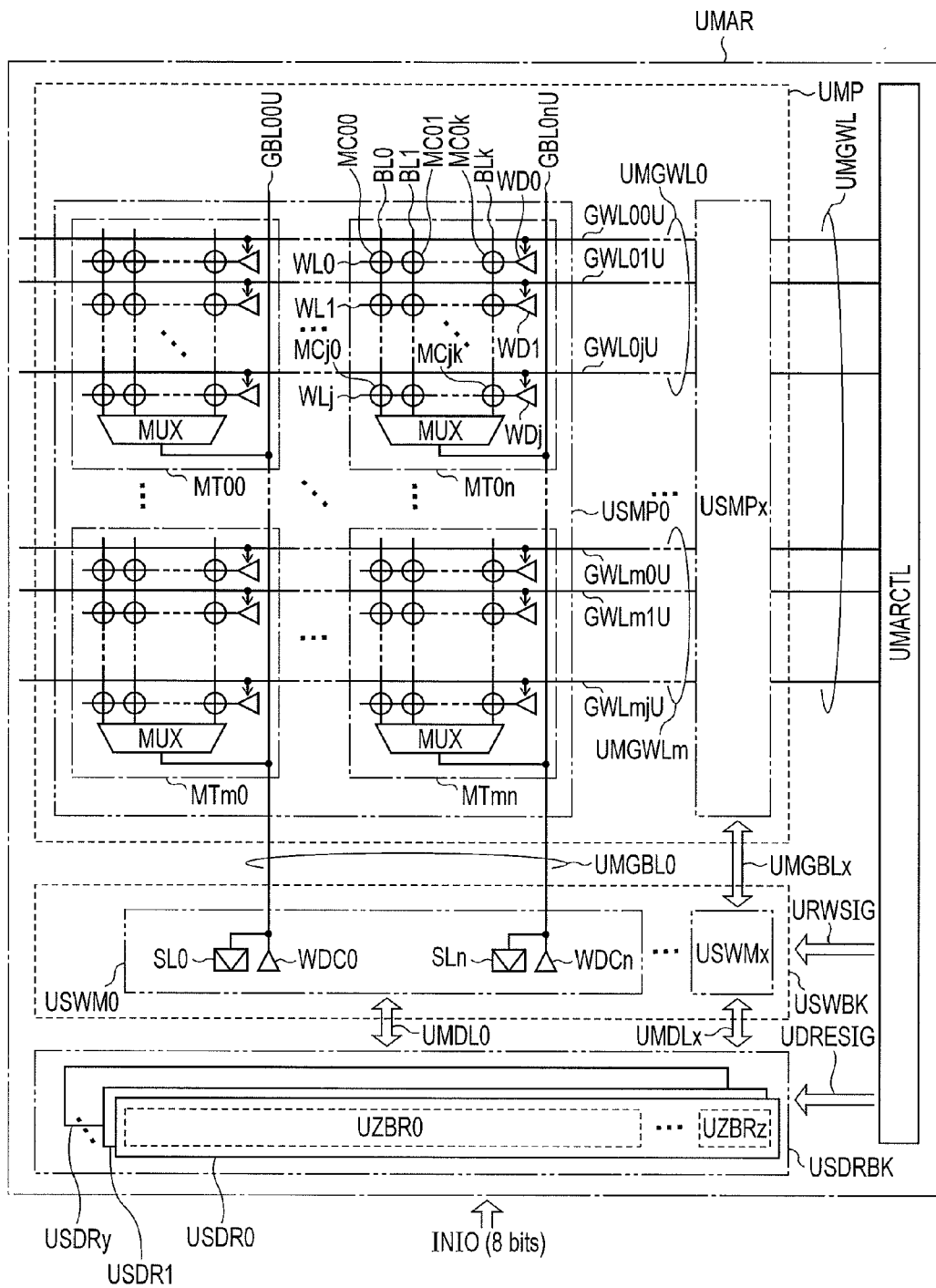
FIG. 4 is a wiring diagram showing one example of the specific structure of the circuit section in the upper section memory region of FIG. 3.
Figure 5:
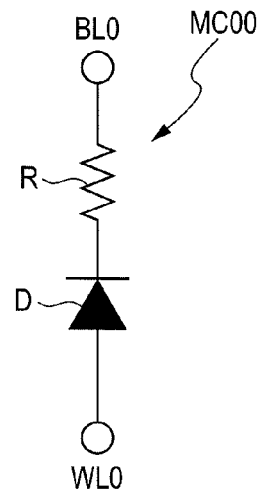
FIG. 5 is a drawing showing one example of the structure of the memory cell in the upper section memory region of FIG. 3.
Figure 6:
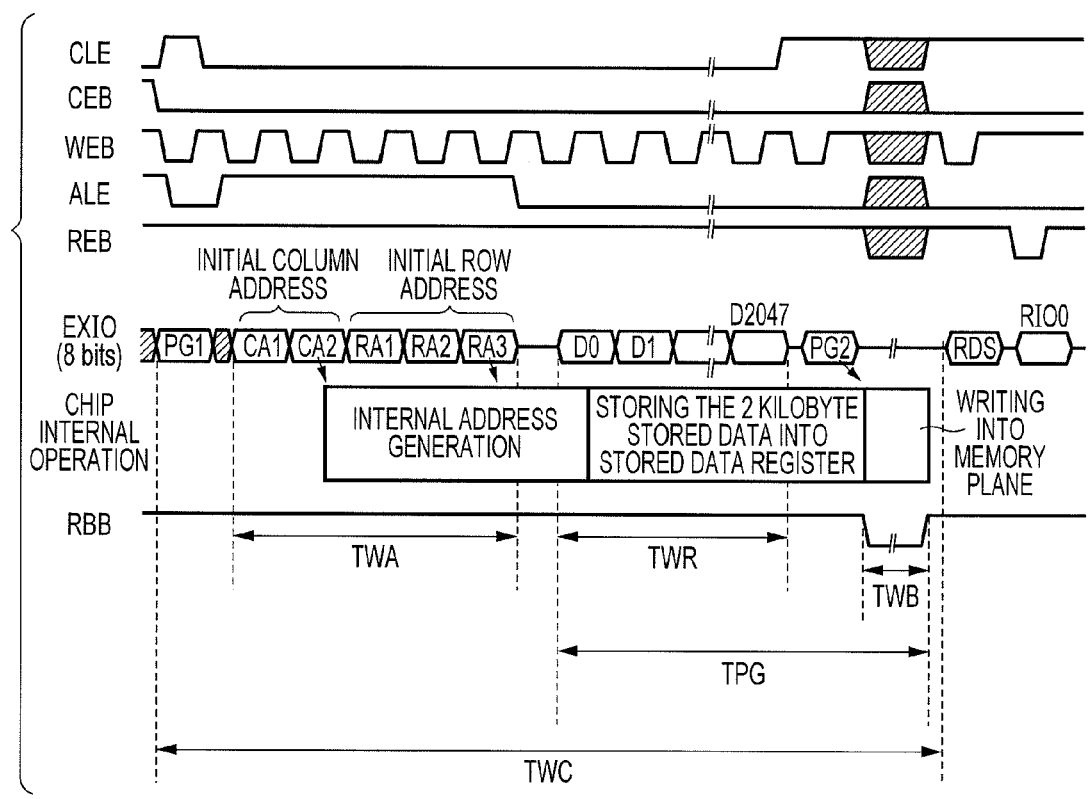
FIG. 6 is a timing chart showing one example of the operation of a two kilobyte rewrite operation in the phase-change memory chip of FIG. 1.
Figure 7:
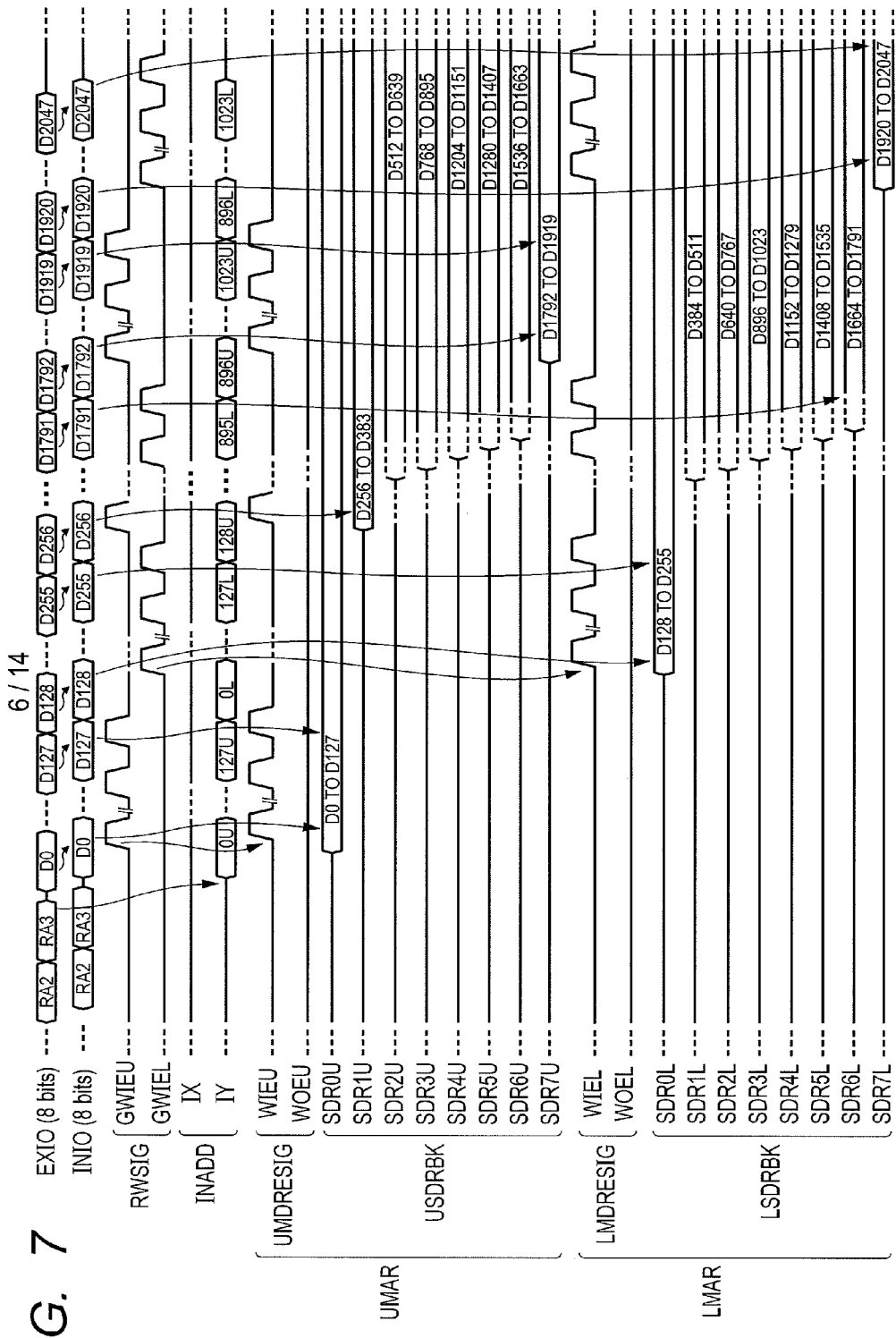
FIG. 7 is a timing chart showing one example of the receive operation sequence for receiving stored data in the rewrite operation of FIG. 6.
Figure 8:
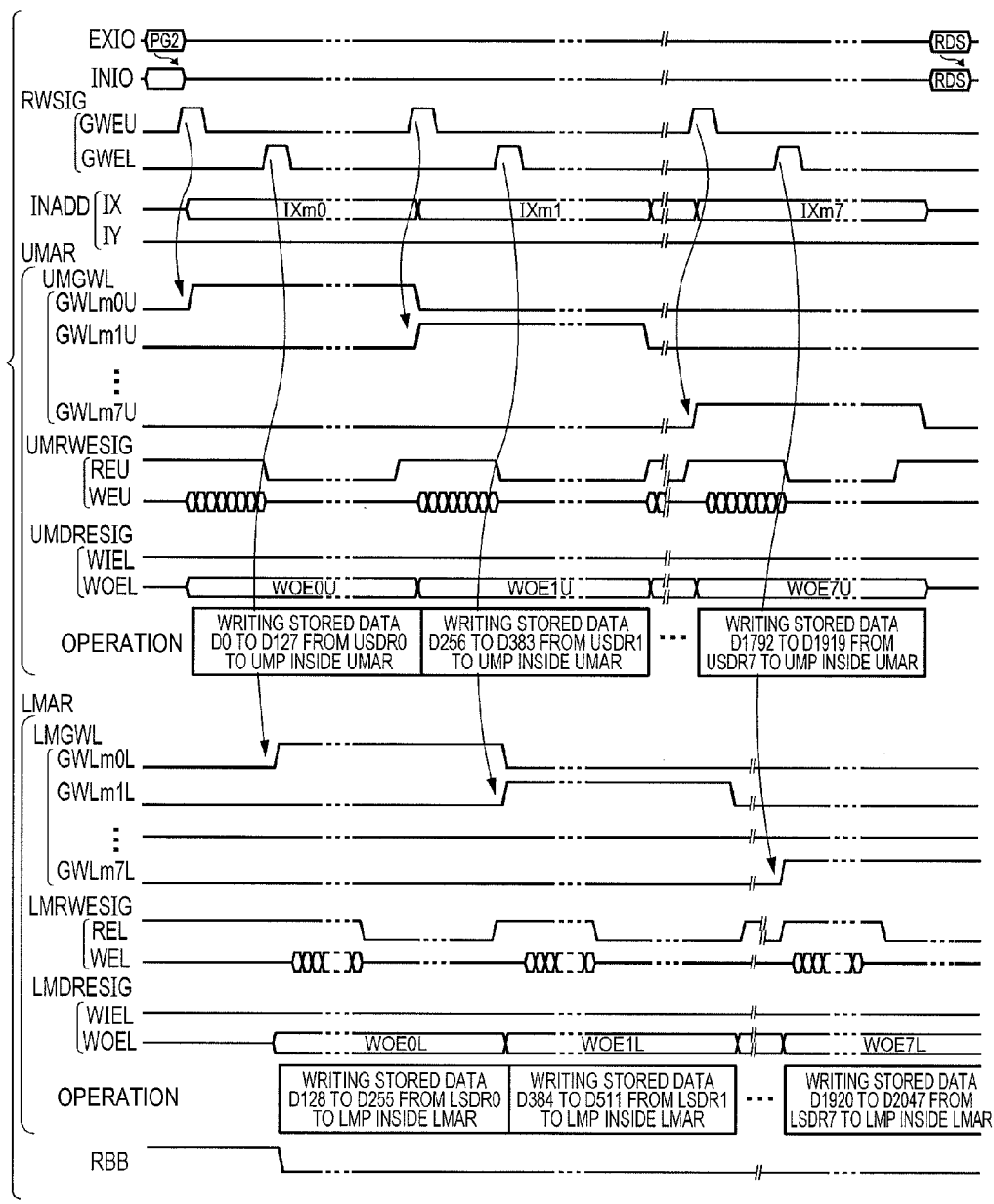
FIG. 8 is a timing chart showing one example of the rewrite operation sequence on the memory plane in the rewrite operation in FIG. 7.
Figure 9:
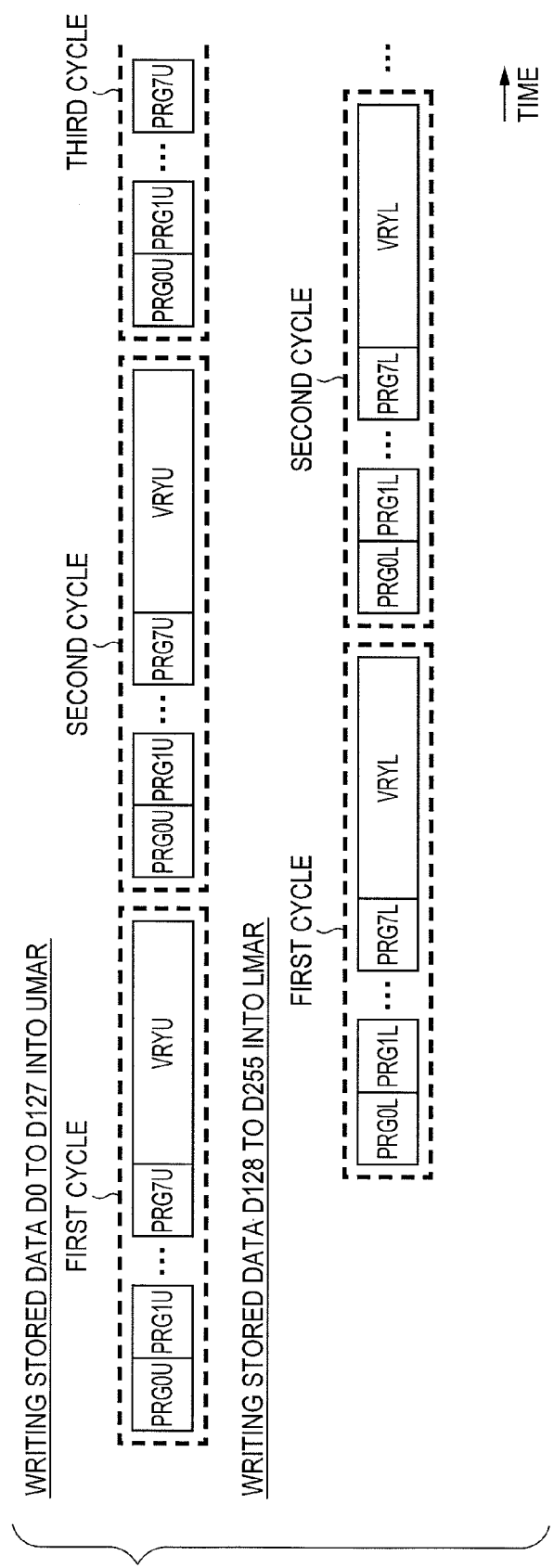
FIG. 9 is a timing chart showing one example of the phase relation between the rewrite operation and the verify read in the rewrite operation sequence in FIG. 8.
Figure 10:
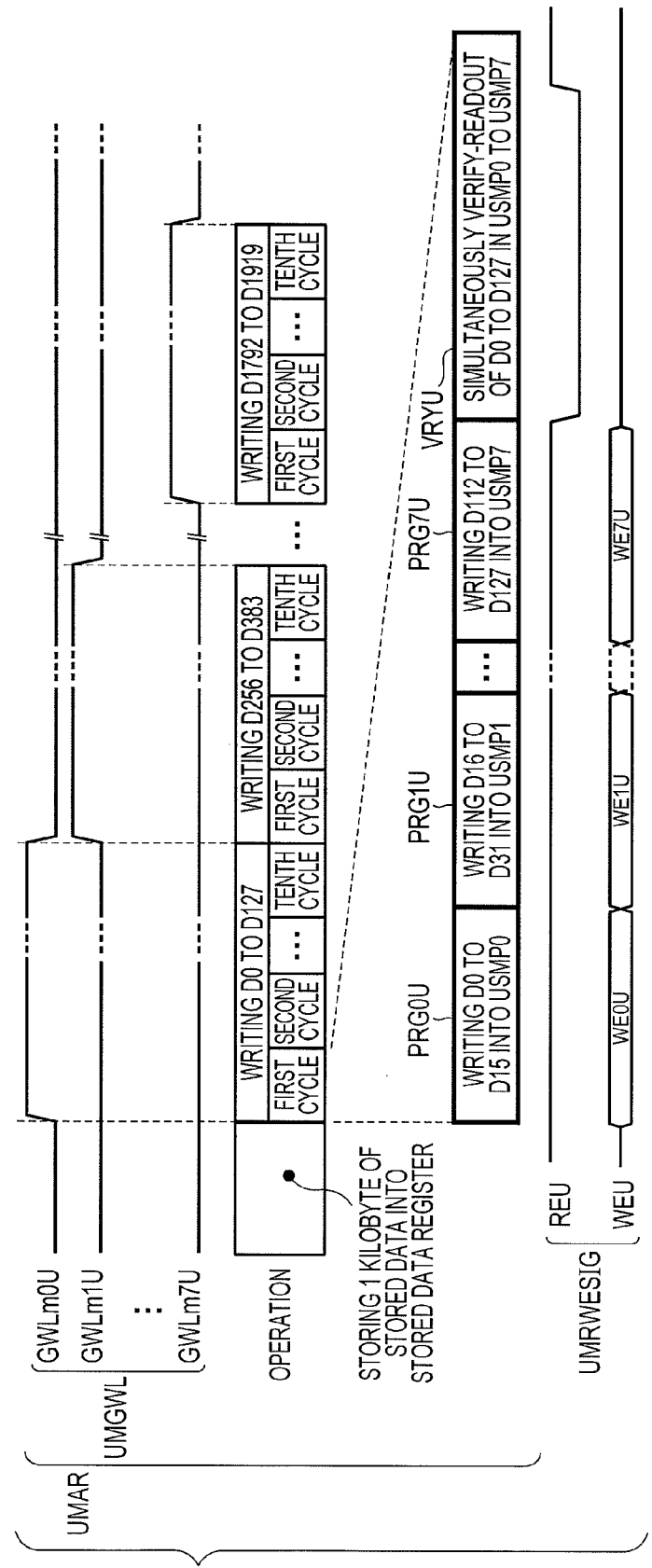
FIG. 10 is a timing chart showing one example of the detailed operation of the upper section memory region in the rewrite operation sequence in FIG. 8.
Figure 11:
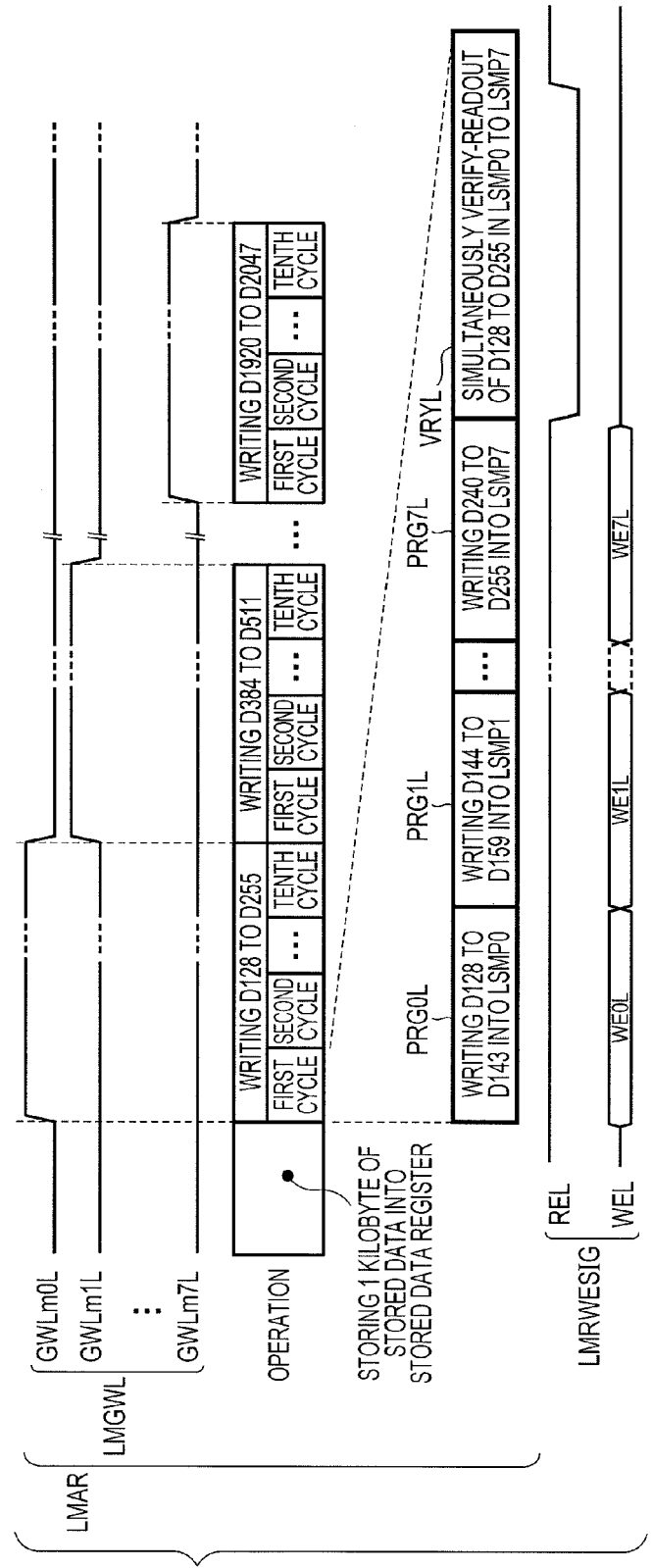
FIG. 11 is a timing chart showing one example of the detailed operation of the lower section memory region in the rewrite operation sequence in FIG. 8.

FIG. 1 is a block diagram showing one example of the structure of a circuit section of the phase-change memory chip of the first embodiment of the present invention. FIG. 2 is a block diagram showing one example of the structure of the circuit section of the upper section memory region on phase-change memory chip in FIG. 1. FIG. 3 is a block diagram showing one example of the structure of the wiring coupling the circuit section in the upper section memory region in FIG. 2. FIG. 4 is a wiring diagram showing one example of the specific structure of the circuit section in the upper section memory region of FIG. 3. FIG. 5 is a drawing showing one example of the structure of the memory cell in the upper section memory region of FIG. 3. FIG. 6 is a timing chart showing one example of the operation of a two kilobyte rewrite operation in the phase-change memory chip of FIG. 1. FIG. 7 is a timing chart showing one example of the receive operation sequence for receiving stored data in the rewrite operation of FIG. 6. FIG. 8 is a timing chart showing one example of the rewrite operation sequence on the memory plane in the rewrite operation in FIG. 7. FIG. 9 is a timing chart showing one example of the phase relation between the rewrite operation and the verify read in the rewrite operation sequence in FIG. 8. FIG. 10 is a timing chart showing one example of the detailed operation of the upper section memory region in the rewrite operation sequence in FIG. 8. FIG. 11 is a timing chart showing one example of the detailed operation of the lower section memory region in the rewrite operation sequence in FIG. 8.

Brief Overview of the Invention

A first embodiment of the present invention comprises a first and a second memory region (upper section memory region UMAR, lower section memory region LMAR). The first memory region is comprised of a first and a second memory plane (sub-plane USMP0, sub-plane USMP1), each containing multiple memory cells arranged in a matrix; and a first and a second block of pairs of sense-latch and write driver (block of pairs of sense-latch and write drivers USWM0, USWM1) to read and to write information in the first and the second memory planes; and a first memory region control circuit (memory region control circuit UMARCTL) to respectively generate: a first write enable signal output to the first block of pairs of sense-latch and write driver; a second write enable signal output to the second block of pairs of sense-latch and write driver (write enable signals WE0U, WE1U), and a first readout start signal (readout start signal REU) output to the first and the second block of pairs of sense-latch and write drivers according to the internal address (internal address INADD) that was input, and the read/write control signal (read/write control signal RWSIG).

The second memory region includes a third and a fourth memory plane (sub-plane USMP0, sub-plane USMP1), each containing multiple memory cells arranged in a matrix; and a third and a fourth block of pairs of sense-latch and write driver (block of pairs of sense-latch and write drivers USWM0, USWM1) to read and to write information in the third and the fourth memory planes; and a second memory region control circuit (memory region control circuit LMARCTL) to respectively generate: a third write enable signal output to the third block of pairs of sense-latch and write driver, a fourth write enable signal output to the fourth block of pairs of sense-latch and write driver (write enable signals WE0L, WE1L), and a second readout start signal (readout start signal REL) output to the third and the fourth block of pairs of sense-latch and write drivers according to the internal address (internal address INADD) that was input, and the read/write control signal (read/write control signal RWSIG).

The third and the fourth write enable signals of the second memory region control circuit are activated, and the third and the fourth block of pairs of sense-latch and write drivers perform the first and second rewrite operations (first cycle of write operation PRG0L, PRG1L in the lower section memory range LMAR in FIG. 9) in the second memory region, during the first period when the first readout start signal of the first memory region control circuit is activated, and the second block of pairs of sense-latch and write driver performs the first verify read (verify read VRYU in the first cycle in the upper section memory region UMAR in FIG. 9) in the first memory region.

In the present embodiment, an example of the phase-change memory chip structure containing an operation sequence that alternately executes a rewrite operation and verify read while time-division rewrite operation is described. In one example given as follows, the memory storage quantity received along with one rewrite command is two kilobytes which is equivalent to the operation unit used in next generation NAND type flash memories.

These operation units are typically established as integral multiples of 512 bytes. This 512 byte is a value equivalent to the information quantity called a sector in the hard disk drive: (HDD).

As more advances are made in miniaturizing NAND type flash memories, more and more memory cells are coupled to one word line, and the number of memory cells selected using those word lines tends to increase. However, even if the number of operation units exceeds two kilobytes, the operating principle described below is expandable as a technology effective in the future.

The embodiment is described next in detail based on the above described points.

Chip Structure

FIG. 1 is a block diagram showing one example of the structure of a circuit block of the phase-change memory chip PCMCP of the present embodiment. The phase-change memory chip PCMCP in FIG. 1 can be broadly grouped into an input/output buffer IOBF, two memory regions (upper section memory region UMAR, lower section memory region LMAR) for data write/readout operation, and a chip control circuit CPCTL.

The input/output buffer IOBF is disposed between the external input/output line EXIO of the phase-change memory chip PCMCP and the internal input/output line INIO and exchanges information in both directions.

The following description assumes that eight lines are utilized as input/output lines and so the information storage quantity exchangeable at one time is eight bits (equals one byte). The number of input/output lines is not limited to eight lines and a variety of forms may be rendered according to the system specification designed into the semiconductor storage device. For example, 16 lines or 32 lines may be utilized.

The memory region as already described is separated into an upper section memory region UMAR and a lower section memory region LMAR. The first letter character of the code expressing the circuit block and signal line block shown below, indicate the memory region that those circuit blocks and signal line blocks belong to.

Namely, the initial letter "U" expresses the circuit block or signal line block belonging to the upper section memory region UMAR; and the initial letter "L" expresses the circuit block or signal line block belonging to the lower section memory region LMAR.

Accordingly, the prior mentioned upper section memory region UMAR is comprised of a memory plane UMP, a block of pairs of sense-latch and write driver USWBK, a stored data register block USDRBK and also a memory region control circuit UMARCTL.

The latter related lower section memory region LMAR is comprised of a memory plane LMP, a block of pairs of sense-latch and write driver LSWBK, a stored data register block LSDRBK and also a memory region control circuit LMARCTL.

The memory planes UMP and LMP each contain multiple memory cells arrayed in a matrix and utilize variable resistor elements made for example from a phase-change material as the storage elements. The information stored in the memory plane UMP is written there from the block of pairs of sense-latch and write driver USWBK by way of the global bit line block UMGBL. The information stored in the memory plane UMP is readout from the global bit line block UMGBL by way of the block of pairs of sense-latch and write driver USWBK.

The information stored in the memory plane LMP is in the same way written from the block of pairs of sense-latch and write driver LSWBK by way of the global bit line block LMGBL. The information stored in the memory plane LMP is read out from the global bit line block LMGBL by way of the block of pairs of sense-latch and write driver LSWBK.

As shown in the same figure, there are two separate memory regions, each containing circuit blocks (described in detail later on) required for reading and writing operations so that the two memory regions can be separately controlled and operated. This structure allows performing the writing operation in one memory region, while the verify read is being performed in the other memory region.

Each of the stored data register blocks USDRBK, LSDRBK are circuit blocks that perform parallel to serial or serial to parallel conversion while temporarily storing information for storage in the corresponding memory planes UMP, LMP.

The stored data register block USDRBK is coupled by way of the data line block UMDL to the block of pairs of sense-latch and write driver USWBK. The stored data register block USDRBK is coupled to the input/output buffer IOBF by way of the input/output lines INIO within the phase-change memory chip PCMCP.

The stored data register block LSDRBK is in the same way coupled by way of the data line block LMDL to the block of pairs of sense-latch and write driver LSWBK. Moreover, the stored data register block LSDRBK is coupled by way of the input/output lines INIO of the phase-change memory chip PCMCP to the input/output buffer IOBF.

Each of the block of pairs of sense-latch and write drivers USWBK and LSWBK contain multiple sense-latches to judge the small signals readout from the corresponding memory planes UMP, LMP in the readout operation, to amplify the signals, and to temporarily store these signals.

These blocks of pairs of sense-latch and write drivers also include multiple write drivers having a function to apply pulses according to the information temporarily stored in the block of pairs of sense-latch and write drivers USDRBK and LSDRBK, to a selected memory cell.

The memory region control circuits UMARCTL, LMARCTL are circuit blocks for generating three signal pairs for controlling the circuit blocks within the memory region according to the internal address INADD, and the read/write control signal RWSIG that were input from the chip control circuit CPCTL described later on.

The first signal pair is the global word line blocks UMGWL, LMGWL for selectively activating the word lines within the memory planes UMP, LMP. The second signal pair is the read/write start signal blocks UMRWESIG, LMRWESIG for selectively activating the blocks of pairs of sense-latch and write driver USWBK, LSWBK. The third signal pair is the stored data register enable signal blocks UMDRESIG, LMDRESIG for controlling the stored data register blocks USDRBK, LSDRBK.

The chip control circuit CPCTL is comprised of an address control circuit ADDCTL, a command-register and control logic circuit CRCL along with a voltage generator circuit VRGT. The address control circuit ADDCTL decodes each of the initial low address signal and initial column address signal received from the input/output line within the phase-change memory chip PCMCP, and generates an initial address STADD within the phase-change memory chip PCMCP.

The chip control circuit CPCTL also generates the internal address INADD of the phase-change memory chip PCMCP according to this initial address STADD and the read/write control signal RWSIG described later on. The chip control circuit CPCTL inputs this internal address INADD into each memory region and the command-register and control logic circuit CRCL described later on.

Along with exchanging (sending and receiving) command signals between the input/output line INIO within the phase-change memory chip PCMCP, the command-register and control logic circuit CRCL temporarily stores the received command signals. The command-register and control logic circuit CRCL also generates signals to internally control the phase-change memory chip PCMCP according to the received command signal and the previously described address INADD, or in other word, generates a read/write control signal RWSIG.

The voltage generator circuit VRGT is a circuit for regulating the voltage within the phase-change memory chip PCMCP according to the read/write control signal RWSIG and signals received by way of the input/output line INIO within the phase-change memory chip PCMCP.

During the readout operation for example, the voltage generator circuit VRGT generates a readout voltage lower than the system power supply (omitted from same figure) in order to prevent destroying data in the selected memory cell. In the rewrite operation, the voltage generator circuit VRGT generates a rewrite voltage equal to or higher than the system power supply in order to induce a definite phase change in the selected memory cell.

Memory Region Structure

The structure of the memory region shown in FIG. 1 is described next in detail while referring to FIG. 2 through FIG. 4.

FIG. 2 is a block diagram showing one example of the structure of a circuit block of the upper section memory region UMAR. A feature of this FIG. 2 as described later is that the block of pairs of sense-latch and write driver USWBK and stored data register block USDRBK are both logically divided into (x+1) number of circuit blocks according to the logically divided structures within the (x+1) number of sub-planes USMP0 through USMPx within the memory plane UMP.

The block of pairs of sense-latch and write driver USWBK is comprised of (x+1) number of small-scale blocks of pairs of sense-latch and write driver USWM0 through USWMx. These small-scale blocks of pairs of sense-latch and write driver USWM0 through USWMx are coupled to the sub-planes USMP0 through USMPx by way of the small-scale global bit line blocks UMGBL0 through UMGBLx, and perform readout and rewrite of the stored data between the corresponding sub-planes USMP0 through USMPx.

The stored data register block USDRBK is comprised of (y+1) number of small-scale stored data register blocks USDR0 through USDRy. Each of these small-scale stored data register blocks USDR0 through USDRy is comprised of (x+1) number of z byte registers UZBR0 through UZBRx.

Each of these z byte registers UZBR0 through UZBRx is a circuit block for temporarily storing information to be stored in the corresponding sub-planes USMP0 through USMPx. Each of the small-scale stored data register blocks USDR0 through USDRy is coupled by way of the common data line blocks UMDL0 through UMDLx, to the block of pairs of sense-latch and write driver USWBK containing the small-scale stored data registers USDR0 through USDRy.

More specifically, each of the z byte registers UZBR0 through UZBRx in the small-scale stored data register blocks USDR0 through USDRy is coupled by way of the corresponding data line blocks UMDL0 through UMDLx to each of the small-scale blocks of pairs of sense-latch and write driver USWM0 through USWMx as shown in FIG. 3.

Here, the data line blocks UMDL0 through UMDLx are structural elements of the data line block UMDL described in FIG. 1. Though a detailed description is given later on, the phase-change memory chip PCMCP shown in FIG. 1 can perform separate and also consecutive read out of large volumes of stored data by placing the stored data register blocks USDRBK, LSDRBK in each of the upper section memory region UMAR, and lower section memory region LMAR.

FIG. 4 is a wiring diagram showing in detail one example of the structure of each circuit block in the upper section memory region UMAR. Each of the sub-planes USMP0 through USMPx is comprised of memory tiles MT00 through MTmn arranged in a matrix of m lines and n rows as typified by the sub-plane USMP0 in the same figure.

These memory tiles MT00 through MTmn numbering (m+1)×(n+1) are arranged so that the (m+1) pair of small-scale global word line blocks UMGWL0 through UMGWLm intersects with the (n+1) pair of small-scale global bit line blocks UMGBL0 through UMGBLn.

Here the (m+1) pair of small-scale global word line blocks UMGWL0 through UMGWLm are structural elements of the global word line block UMGWL. Moreover, the (n+1) pairs of small-scale global bit line blocks UMGBL0 through UMGBLn are structural elements of the global word line block UMGBL.

Each of the memory tiles MT00 through MTmn is comprised of memory cells MC00 through MCjk arranged in a matrix of (j+1) lines (k+1) rows; bit line select circuits MUX, and (j+1) number of word drivers WD0 through WDj as typified by the memory tile MT0n.

These (j+1)×(k+1) number of memory cells MC00 through MCjk are each arranged to intersect with the (j+1) lines of word lines WL0 through WLj and (k+1) lines of bit lines BL0 through BLk.

In the structure of the memory cell MC00 for example as shown in FIG. 5, the resistance-change type storage elements R and diodes D formed of chalcogenide material, are coupled in series to intersect with the word lines WL0 and bit lines BL0.

The bit line select circuits MUX are arranged between the (k+1) bit lines BL0 through BLk and the global bit line GBL0nU, and one bit line selected from the (k+1) bit lines BL0 through BLk is coupled to the global bit line GBL0nU.

The word drivers WD0 through WDj are arranged between the word lines WL0 through WLj and the global word lines GWL00U through GWL0jU (namely, the small-scale global word line block UMGWL0).

A word driver is activated according to one global word line selected from the global word lines GWL100U through GWL0jU, to select one among the (j+1) word lines WL0 through LWj, and supplies the specified voltage.

On the phase-change memory, information is generally rewritten by utilizing Joule heat so that a sufficient quantity of electrical current must be applied in order to heat the storage layer that was formed in the chalcogenide material and this requires that the word driver serving as the electrical current power supply possesses a large drive capacity.

In the above described structure and operation for memory tiles however, one memory cell performs the read/write operations in one memory tile. The circuit area of the word driver can therefore be reduced, and the usage rate of the memory cell can be improved.

In the block of pairs of sense-latch and write driver USWBK, each of the (x+1) number of small-scale blocks of pairs of sense-latch and write driver USWM0 through USWMx is for example comprised of (n+1) pairs of sense-latches (SL0 through SLn) and write drivers (WDC0 through WDCn) such as a pair of the sense-latch SL0 and write driver WDC0 within the small-scale block of pairs of sense-latch and write driver USWM0.

These sense-latch and write driver pairs are each placed at (n+1) global bit lines GBL00U through GBL0nU (namely small-scale global bit line block UMGBL0).

Each of the (n+1) pairs of sense-latch and write driver is coupled for example by way of the data line block UMDL0 such as the small-scale block of pairs of sense-latch and write driver USWM0 to the z byte register UZBR0 in the small-scale stored data register blocks USDR0 through USDRy within the stored data register block USDRBK.

Overview of Rewrite Operation

FIG. 6 shows one example of the two kilobyte rewrite operation. In this operation, the command latch start signal CLE at low level is driven to high level, and the chip start signal CEB and address latch start signal ALE are driven to low level.

The two kilobyte write command signal PG1 is then input by way of the external input/output line EXIO. This command signal PG1 is input to the phase-change memory chip PCMCP by the rising edge of the write start signal WEB.

Next in this operation, the command latch start signal CLE already at high level is driven to low level, and the address latch start signal ALE already at low level is driven to high level, and the initial column address is separately input two times (CA1, CA2), and the initial row address is separately input three times (RA1, RA2, RA3) in sequence.

These addresses are input to the phase-change memory chip PCMCP by the rising edge of the write start signal WEB. The column address is input two times and the row address is input three times to conform to the example in the standards for NAND type flash memories, and other chip specifications such as for inputting addresses with a different length or different sequence can also be utilized.

The operation next drives the address latch start signal ALE that was at high level, to low level, and inputs the two kilobyte stored data D0 through D2047 from the external input/output line EXIO. Here, each of the stored data D0 through D2047 are in information quantities of one byte (=eight bits).

The operation also drives the command latch start signal CLE that was at low level, to high level, and inputs the command signal PG2 from the external input/output line EXIO. After this command signal PG2 is input to the phase-change memory chip PCMCP by the rising edge (pulse) of the write start signal WEB, the rewrite operation is performed in both memory regions.

The ready/busy signal RBB set to high level is at this time driven to low level. When the rewrite operation ends, the ready/busy signal RBB set at low level, is then driven to high level.

The time required from the start of inputting the stored data D0 to the completion of rewrite operation, is expressed by the two kilobyte rewrite operation time TPG. Moreover, the time including the address input time TWA that the start column address and the start row address are input, the data storage time TWR that the stored data is stored in the small-scale stored data register block, and the busy time information TWB that the ready/busy signal RBB is driven to low level, are set as the access cycle time TWC. Most of the two kilobyte rewrite operation time TPG is the data storage time TWR and the busy time TWB.

Finally, the state readout command signal RDS is input in order to check if the rewrite operation has succeeded or not. This state readout command signal RDS is input into the phase-change memory chip PCMCP by the rising edge of the write start signal WEB. The post-rewrite state RIO0 is then output from the external input/output line EXIO in synchronization with the readout start signal REB.

Temporary Storage Operation During Rewrite Operation

The two kilobyte stored data D0 through D2047 input to the internal input/output line INIO from the external input/output line EXIO is input respectively into the information storage register blocks USDRBK, LSDRBK of the upper section memory region UMAR, and the lower section memory region LMAR in the sequence as shown in FIG. 7.

A feature of the operation sequence shown in FIG. 7 is that the two kilobyte stored data D0 through D2047 is subdivided into units of 128 bytes, and transferred alternately to the upper section memory region UMAR, and the lower section memory region LMAR.

Here, 1024 bytes which is half the information quantity of the two kilobytes is transferred to the stored data register block USDRBK of the upper section memory region UMAR shown in FIG. 3. Here, when the number of memory tiles linked to one global word line is 1024 then the amount of information that can be read out and written at one time is 128 bytes (equals 1024 bits) so that 1024 bytes of stored data is written in a total of eight separate times.

Therefore, for storing all of the 1024 bytes of stored data, the stored data register block USDRBK is preferably configured as eight small-scale stored data register blocks USDR0 through USDRy (y=7) with 128 bytes as one unit, for achieving uniformity in the rewrite operation sequence.

Further, during time-division rewriting for example of 16 bytes (equals 128 bits) at a time, each of these eight small-scale stored data register blocks USDR0 through USDR7 is preferably configured from eight z byte registers UZBR0 through UZBRx (x=7).

The global stored data register enable signals GWIEU, GWIEL are described among the structural elements for the read/write control signal RWSIG in FIG. 7. The global stored data register enable signal GWIEU is input to the memory region control circuit UMARCTL within the upper section memory region UMAR, and is utilized to temporarily store the stored data input from the internal input/output line INIO into the stored data register block USDRBK within the upper section memory region UMAR.

The other global stored data register enable signal GWIEL on the other hand is input to the memory region control circuit LMARCTL within the lower memory region LMAR, and utilized to temporarily store the stored data input from the internal input/output line INIO into the stored data register block LSDRBK within the lower section memory region LMAL. Moreover, the internal row address IX and the internal column address IY are described among the structural elements for the internal address INADD.

Moreover, the stored data input enable signals WIEU, WIEL and the stored data output enable signals WOEU, WOEL are described among the structural elements for the stored data register enable signal blocks UMDRESIG, LMDRESIG in the upper section memory region UMAR and the lower section memory region LMAR in FIG. 7.

Further, the stored data input enable signals WIEU, WIEL are each utilized to temporarily store (buffer) the stored data transferred from the internal input/output line INIO to the stored data register blocks USDRBK, LSDRBK within each memory region.

The latter stored data output enable signals WOEU, WOEL are each utilized to selectively send information temporarily stored in the stored data register blocks USDRBK, LSDRBK by way of the data line blocks UMDL, LMDL to the corresponding blocks of pairs of sense-latch and write driver USWBK, LSWBK.

The operation is described next in detail.

After entry of the initial address signal (row address RA2 and row address RA3 in FIG. 7) is complete, the internal column addresses IY0U through IY127U, and the 128 cycle global stored data register enable signal GWIEU are each generated for inputting the first 128 bytes of stored data.

Then, in the upper section memory region UMAR, the stored data input enable signal WIEU is generated in synchronization with the global stored data register enable signal GWIEU. The stored data D0 through D127 are input in sequence to the z byte registers UZBR0 through UZBR7 of the small-scale stored data register block USDR0 in the stored data register block USDRBK within the upper section memory region UMAR, in synchronization with the internal column addresses IY0U through IY127U and stored data input enable signal WIEU.

Next the internal column addresses IY0L through IY127L, and the 128 cycle global stored data register enable signal GWIEL are each generated for inputting the stored data D128 through D255.

The stored data input enable signal WIEL is then generated in the lower section memory region LMAR in synchronization with the global stored data register enable signal GWIEL. The stored data D128 through D255 are input in sequence to the z byte registers LZBR0 through LZBR7 of the small-scale stored data register block LSDR0 of the stored data register block LSDRBK within the lower section memory region LMAR in synchronization with these internal column addresses IY0L through IY127L and the stored data input enable signal WIEL.

The internal column addresses IY128U through IY255U, and the 128 cycle global stored data register enable signal GWIEU are each generated for inputting the stored data D256 through D383.

The stored data input enable signal WIEU is then generated in the upper section memory region UMAR in synchronization with the global stored data register enable signal GWIEU. The stored data D256 through D383 are input in sequence to the z byte registers UZBR0 through UZBR7 of the small-scale stored data register block USDR1 of the stored data register block USDRBK within the upper section memory region UMAR in synchronization with the internal column addresses IY128U through IY255U and the stored data input enable signal WIEU.

Hereafter, the transfer of stored data is performed in the same way, with the stored data D1792 through D1919 being input to the small-scale stored data register block USDR7 of stored data register block USDRBK within the upper section memory region UMAR, and the stored data D1920 through D2047 being input to the small-scale stored data register block LSDR7 of stored data register block LSDRBK within the lower section memory region LMAR.

The transfer of the stored data now terminates.

At this time, a portion of the stored data can be sent first to the corresponding blocks of pairs of sense-latch and write driver USWBK, LSWBK, prior to storage of all of the received stored data in each of the stored data register blocks USDRBK, LSDRBK.

Rewrite Operation onto the Memory Planes

The total of two kilobytes of stored data input to the stored data register blocks USDRBK, LSDRBK in the upper section memory region UMAR and the lower section memory region LMAR are written 128 bytes each in the two memory planes UMP, LMR by alternately selecting global word lines as shown in FIG. 8.

In this FIG. 8, the global write enable signals GWEU, GWEL are described among the structural elements for the read/write control signal RWSIG. The one global write enable signal GWEU is input to the memory region control circuit UMARCTL within the upper section memory region UMAR. The other global write enable signal GWIEL is input to the memory region control circuit LMARCTL within the lower section memory region LMAR.

The readout start signals REU, REL and the write enable signals WEU, WEL that are structural elements for the read/write start signal blocks UMRWESIG, LMRWESIG are each described in addition to the stored data register enable signal blocks UMDRESIG, LMDRESIG in the upper section memory region UMAR and the lower section memory region LMAR.

The prior mentioned readout start signals REU, REL are utilized to start each sense-latch within the corresponding blocks of pairs of sense-latch and write driver USWBK, LSWBK. The latter mentioned write enable signals WEU, WEL are utilized to start each of the write drivers within the same corresponding circuit block (blocks of pairs of sense-latch and write driver USWBK, LSWBK).

The different phase eight cycle global write enable signals GWEU, GWEL, the eight internal row addresses IXm0 through IXm7, and further the different phase stored data output enable signals WOEU, WOEL are each generated in sequence when the two kilobyte stored data is temporarily written into the stored data register blocks USDRBK, LSDRBK within each of the memory regions UMAR, LMAR.

In other words, when the initial internal row address IXm0 is issued, the memory region control circuits UMARCTL and LMARCTL within each of the memory regions UMAR, LMAR are synchronized with the global write enable signals GWEU, GWEL and select each of the global word lines GWLm0U, GWLm0L according to the internal row address IXm0.

Moreover, in the upper section memory region UMAR, activating the stored data output enable signal WOE0U, transfers the 128 bytes of the stored data D0 through D127 temporarily stored in the small-scale stored data register block USDR0 in the stored data register block USDRBK, to the blocks of pairs of sense-latch and write driver USWBK and starts the write operation.

Also, activating the stored data output enable signal WOE0U in the lower section memory region LMAR at a timing according to the phase difference between the global write enable signal GWEU and the global write enable signal GWEL, transfers the 128 bytes of the stored data D128 through D255 temporarily stored in the small-scale stored data register block LSDR0 in the stored data register block LSDRBK, to the block of pairs of sense-latch and write driver LSWBK and starts the write operation.

Next, when the internal row address IXm1 is issued, the memory region control circuits UMARCTL, LMARCTL within each memory region UMAR, LMAR, synchronize with the global write enable signals GWEU, GWEL, and select each of the global word lines GWLm1U, GWLm1L according to the internal row address IXm1.

In the upper section memory region UMAR, activating the stored data output enable signal WOE1U transfers the 128 bytes of stored data D256 through D383 temporarily stored in the small-scale stored data register block USDR1 in the stored data register block USDRBK, to the blocks of pairs of sense-latch and write driver USWBK and starts the write operation.

In the lower section memory region LMAR, activating the stored data output enable signal WOE1L at a timing according to the phase difference between the global write enable signal GWEU and the global write enable signal GWEL, transfers the 128 bytes of stored data D384 through D511 temporarily stored in the small-scale stored data register block LSDR1 in the stored data register block LSDRBK, to the block of pairs of sense-latch and write driver LSWBK and starts the write operation.

Subsequent stored data is alternately written 128 bytes at a time in the upper section memory region UMAR and lower section memory region LMAR according to the internal row addresses IXm2 through IXm7 in the same way as the above information.

The rewrite operation shown in FIG. 8 is described in detail next while focusing on the rewrite operation for the stored data D0 through D255 as one example.

This rewrite operation has two features as shown in FIG. 9. A first feature is that along with alternately repeating the write operation PRG0U through PRGxU in the upper section memory region UMAR, and the write operation PRG0L through PRGxL in the lower section memory region LMAR, the write operation (PRG0U through PRGxU, or PRG0L through PRGxL) is performed in one memory region, while the verify read operation (VRYL, or VRYU) is performed in the other memory region.

Here, the number of verify read operations depends on the extent of irregularities (variations) in the memory cell characteristics. However in the example of an operation sequence given in FIG. 10 and FIG. 12 described later on, there are 10 verify read operations.

A second feature of the rewrite operation is that the 128 bytes of stored data is subdivided into (x+1), and the two kilobytes in (x+1) portions at a time are selectively written. The number of subdivisions is determined according to the rewrite operation current allowed by the phase-change memory chip PCMCP shown in FIG. 1.

In the example of an operation sequence shown in FIG. 10 and FIG. 12 described later on, x is 7. In other words, in the write operation PRG0U through PRGxU and the write operation PRG0L through PRGxL (x=7), the 128 bytes of stored data is 16 bytes each while divided into eight portions.

This type of selection operation is performed for example on the upper section memory region UMAR according to the write enable signals WE0U through WE7U that are structural elements for the read/write control signal block UMRWESIG as shown in FIG. 10.

The write enable signal WE0U is input according to the small-scale block of pairs of sense-latch and write driver USWM0 of the block of pairs of sense-latch and write driver UWSBK in FIG. 4.

In the same way, the write enable signal WE1U is input to the corresponding small-scale block of pairs of sense-latch and write driver USWM1, the write enable signal WE2U is input to the corresponding small-scale block of pairs of sense-latch and write driver USWM2, and the write enable signal WE3U is input to the corresponding small-scale block of pairs of sense-latch and write driver USWM3.

Also, the write enable signal WE4U is input to the corresponding small-scale block of pairs of sense-latch and write driver USWM4, the write enable signal WE5U is input to the corresponding small-scale block of pairs of sense-latch and write driver USWM5, the write enable signal WE6U is input to the corresponding small-scale block of pairs of sense-latch and write driver USWM6, and the write enable signal WE7U is input to the corresponding small-scale block of pairs of sense-latch and write driver USWMx (x=7).

The stored data D0 through D15 temporarily stored in the z byte register UZBR0 (here, z=16) within the small-scale stored data register block USDR0 in the stored data register block USDRBK is accordingly written into the memory cell of the memory tiles MTm0 through MTmn (n=127) intersecting each of the global word lines GWLm0U of the sub-plane USMP0, by way of the write drivers WDC0 through WDCn (n=127) in the small-scale block of pairs of sense-latch and write driver USWM0.

In the case for example where this memory cell is MC00, the memory region control circuit UMARCTL controls the bit line select circuit MUX according to the initial address generated by the address control circuit ADDCTL, and couples each of the global bit lines GBL00U through GBL0nU to each of the bit lines BL0 in the memory tile MTm0 through MTmn (n=127).

The stored data D16 through D31 temporarily stored in the z byte register UZBR1 within the small-scale stored data register block USDR0 in the stored data register block USDRBK, is accordingly written in the same way into the memory cell of the memory tiles MTm0 through MTmn (n=127), intersecting each of the global word lines GWLm0U of the sub-plane USMP1, by way of the write drivers WDC0 through WDCn (n=127) in the small-scale block of pairs of sense-latch and write driver USWM1.

After the writing operation on the stored data D32 through D127, hereafter in the same way, the activating of the readout start signal REU that is a structural element for the read/write control signal block UMRWESIG, causes simultaneous readout of these 128 bytes of stored data and a judgment is made on whether the rewrite operation succeeded or not.

In the above operation, the rewrite operation is repeated for a maximum of 10 times until the rewrite operation has succeeded, and the writing operation for the stored data D0 through D127 then ends.

Figure 12:
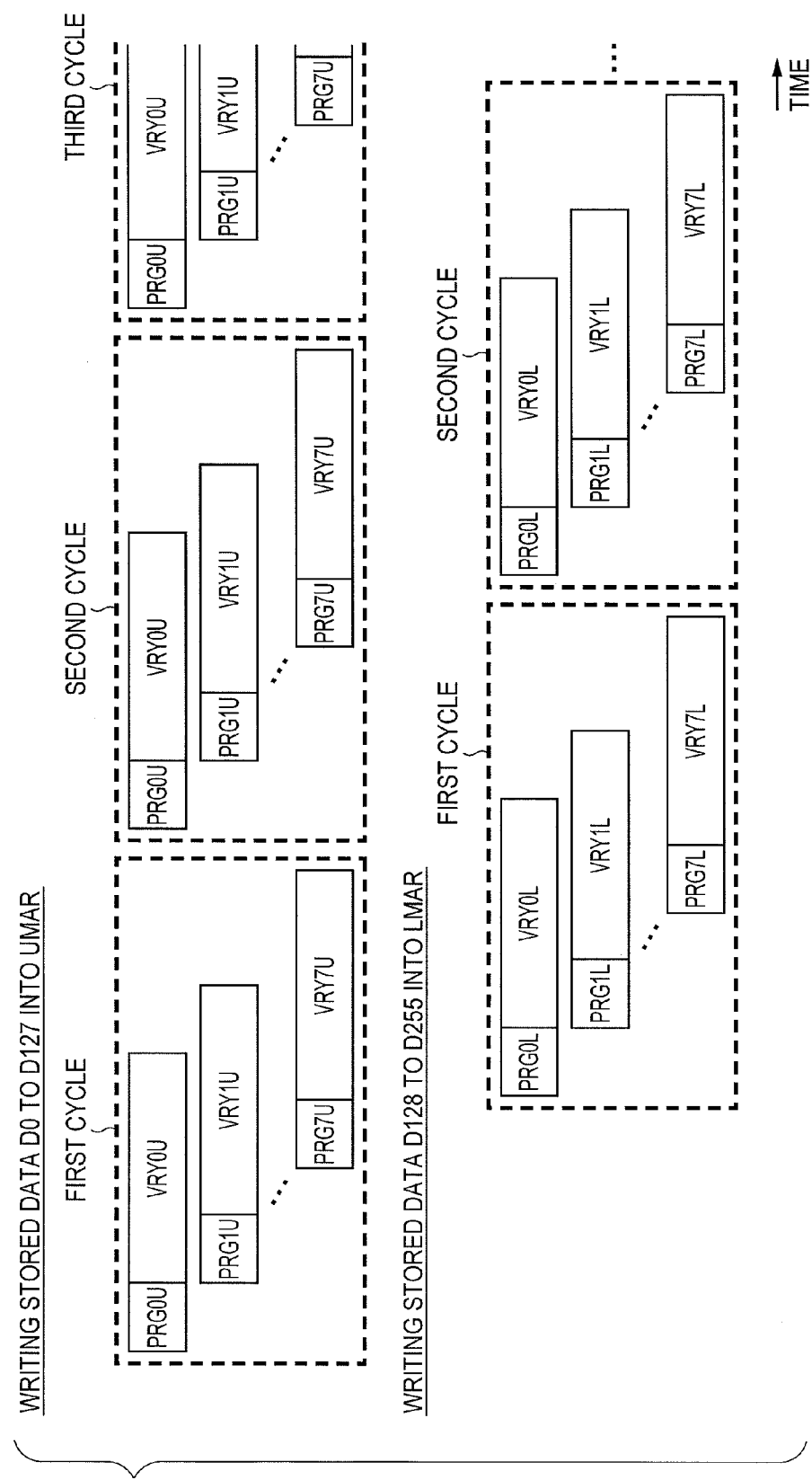
FIG. 12 is a timing chart showing one example of the phase relation between the verify read and the rewrite operation in the rewrite operation sequence on the phase-change memory chip in the second embodiment of the present invention.

The rewrite operation for writing the stored data D128 through D255 according to the write enable signals WE0L through WE7L that are structural elements for the read/write control signal LRWSIG is performed in the lower section memory region LMAR as shown in FIG. 12.

Namely, the input of the write enable signal WE0L to the corresponding small-scale block of pairs of sense-latch and write driver LSWM0 of the block of pairs of sense-latch and write driver LSWBK can be understood by referring to FIG. 1 and FIG. 4.

In the same way, the write enable signal WE1L is input to the corresponding small-scale block of pairs of sense-latch and write driver LSWM1, the write enable signal WE2L is input to the corresponding small-scale block of pairs of sense-latch and write driver LSWM2, the write enable signal WE3L is input to the corresponding small-scale block of pairs of sense-latch and write driver LSWM3, and the write enable signal WE4L is input to the corresponding small-scale block of pairs of sense-latch and write driver LSWM4.

Further, the write enable signal WE5L is input to the corresponding small-scale block of pairs of sense-latch and write driver LSWM5, the write enable signal WE6L is input to the corresponding small-scale block of pairs of sense-latch and write driver LSWM6, and the write enable signal WE7L is input to the corresponding small-scale block of pairs of sense-latch and write driver LSWMx (x=7).

The stored data D128 through D143 temporarily stored in the z byte register LZBR0 (here, z=16) within the small-scale stored data register block LSDR0 in the stored data register block LSDRBK is accordingly written into the memory cell of the memory tiles MTm0 through MTmn (n=127) intersecting each of the global word lines GWLm0L of the sub-plane LSMP0, by way of the write drivers WDC0 through WDCn (n=127) in the small-scale block of pairs of sense-latch and write driver LSWM0.

For example in the case where this memory cell is MC00 (FIG. 4), the memory region control circuit LMARCTL controls the bit line select circuit MUX according to the initial address generated by the address control circuit ADDCTL, and couples each of the global bit lines GBL00L through GBL0nL to each of the bit lines BL0 in the memory tile MTm0 through MTmn (n=127).

The stored data D144 through D159 temporarily stored in the z byte register LZBR1 within the small-scale stored data register block LSDR0 in the stored data register block LSDRBK, is accordingly written in the same way into the memory cell of the memory tiles MTm0 through MTmn (n=127), intersecting each of the global word lines GWLm0L of the sub-plane LSMP1, by way of the write drivers WDC0 through WDCn (n=127) in the small-scale block of pairs of sense-latch and write driver LSWM1.

After the writing operation on the stored data D160 through D255, hereafter in the same way, the activating of the readout start signal REL that is a structural element for the read/write control signal block LRWSIG causes simultaneous readout of these 128 bytes of stored data and a judgment is made on whether the rewrite operation succeeded or not.

In the above operation, the rewrite operation is repeated for a maximum of 10 times until the rewrite operation has succeeded, and the writing operation for the stored data D128 through D255 then ends.

In FIG. 10 and FIG. 12, the description focused on the rewrite operation for the 256 bytes of stored data D0 through D255, however the remaining 1792 bytes of stored data D256 though D2047 is also rewritten using the same sequence.

For example, in the upper section memory region UMAR, the stored data D256 through D271 temporarily stored in the z byte register UZBR0 within the small-scale stored data register block USDR1 in the stored data register block USDRBK, is accordingly written into the memory cell of the memory tiles MTm0 through MTmn (n=127), intersecting each of the global word lines GWLm1U of the sub-plane USMP0, by way of the write drivers WDC0 through WDCn (n=127) in the small-scale block of pairs of sense-latch and write driver USWM0.

Next, the stored data D272 through D287 temporarily stored in the z byte register UZBR1 within the small-scale stored data register block USDR1 in the stored data register block USDRBK, is accordingly written into the memory cell of the memory tiles MTm0 through MTmn (n=127), intersecting each of the global word lines GWLm1U of the sub-plane USMP1, by way of the write drivers WDC0 through WDCn (n=127) in the small-scale block of pairs of sense-latch and write driver USWM1. The subsequent writing operation on the stored data D288 through D383 is the same.

In a separate example, in the lower section memory region LMAR, the stored data D384 through D399 temporarily stored in the z byte register LZBR0 within the small-scale stored data register block LSDR1 in the stored data register block LSDRBK, is written into the memory cells of the memory tiles MTm0 through MTmn (n=127), intersecting each of the global word lines GWLm1L of the sub-plane LSMP0, by way of the write drivers WDC0 through WDCn (n=127) in the small-scale block of pairs of sense-latch and write driver LSWM0.

Next, the stored data D400 through D415 temporarily stored in the z byte register LZBR1 within the small-scale stored data register block LSDR1 in the stored data register block LSDRBK, is accordingly written into the memory cells of the memory tiles MTm0 through MTmn (n=127), intersecting each of the global word lines GWLm1L of the sub-plane LSMP1, by way of the write drivers WDC0 through WDCn (n=127) in the small-scale block of pairs of sense-latch and write driver LSWM1. The subsequent writing operation on the stored data D416 through D511 is the same.

This type of structure and operation obtains the following effects in the first embodiment.

When there are large irregularities (or variations) among memory cell characteristics in phase-change memory chip PCMCP, performing verify read on one memory region while performing the time-division write operation on the other memory region, allows cancelling out the time required for the verify read with the time required for the time-division write operation, thus achieving both improved reliability by combining the verify readout time with the re-write time while suppressing the rewrite operation time, and suppressing the peak operating current value by the time-division write operation.

In the first embodiment as already described, the two kilobytes of stored data for performing the two kilobyte rewrite operation are subdivided into 16 portions of 128 bytes each and each respectively written eight times on the upper section memory region UMDR, and the lower section memory region LMDR. An internal address is therefore generated eight times corresponding to the memory plane MP. Moreover, eight (16 for both regions) small-scale register blocks of 128 bytes each are prepared.

Another method does not utilize a data structure where the stored data D0 through D2047 is respectively paired with the internal column address IY.

In this method for example, a counter is utilized to count stored data quantity input to the small-scale stored data register blocks USDR0 through USDR7, and LSDR0 through LSDR7. The stored data quantity that was sent is measured, and when that stored data quantity reaches a specified value, the subsequent stored data is input to a new small-scale stored data register block. Utilizing this method eliminates the need for matching the internal column address pair by pair with the stored data (except for the initial section). It can also reduce the transfer of data within the phase-change memory PCMPC, and reduce the power consumption to drive the signal line.

Moreover, until now the word line had to be reselected from one among the small-scale stored data register blocks USDR0 through USDRy (y=7), LSDR0 through LSDRy (y=7) each time the temporarily stored data was to be written onto the sub-planes USMP0 through USMPx, and LSMP0 through LSMPx (X=7).

However, the memory cell selection operation is not limited to this method, and if eight or more word lines BL0 through BLk (k>7) are made within one memory tile then a memory selection operation is possible that allows switching with just one bit line selector circuit MUX within the memory tile.

In this case, in the upper section memory region UMAR, all data from the eight small-scale stored data register blocks USDR0 through USDRy (y=7) can be written into memory cells on the same word line.

In the same way, in the lower section memory region LMAR, all data from the eight small-scale stored data register blocks LSDR0 through LSDRy (y=7) can be written into memory cells on the same word line. The number of selections on a word line can therefore be reduced so that the power required for driving the word line can be suppressed.

Second Embodiment

Figure 13:
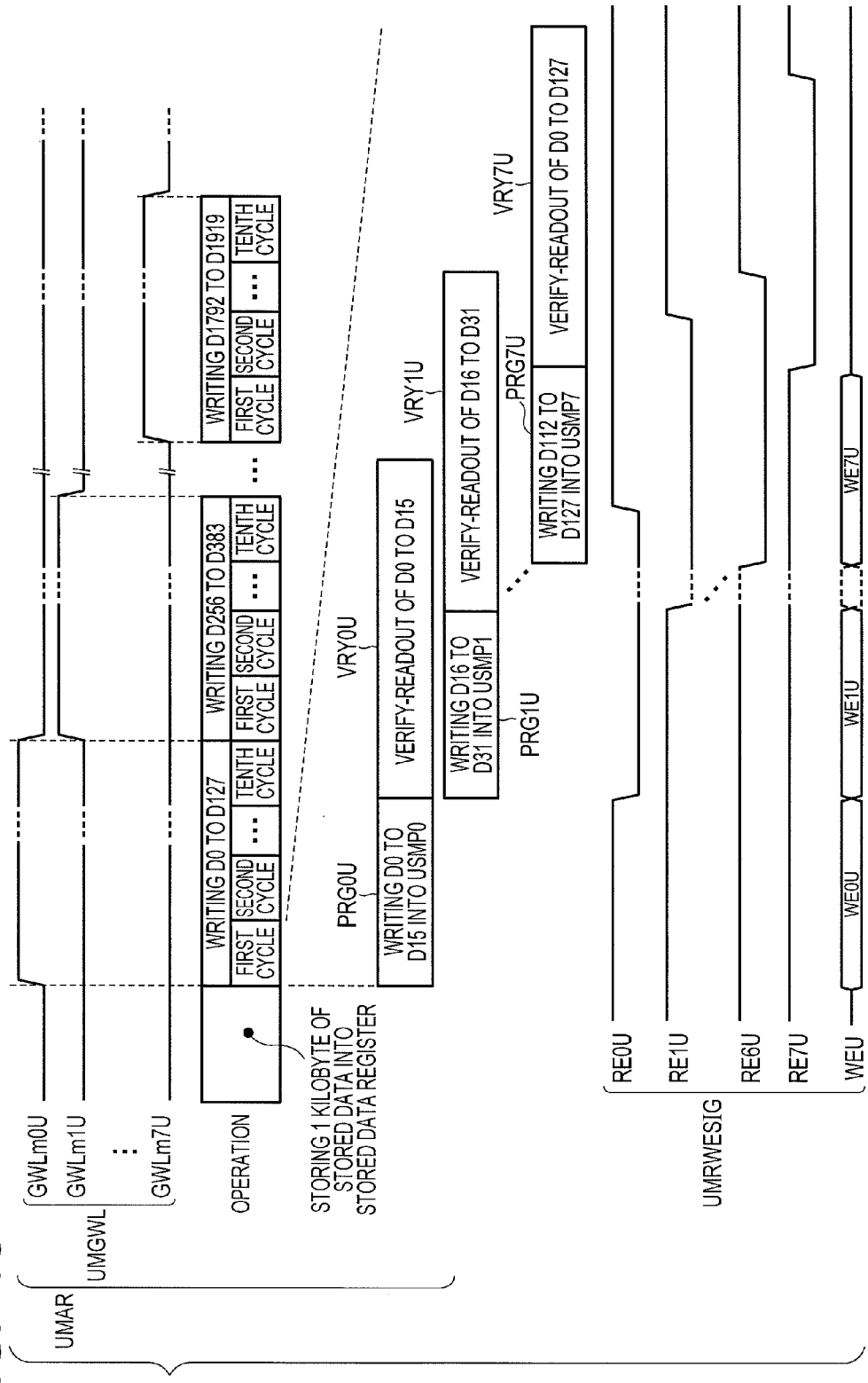
FIG. 13 is a timing chart showing one example of the detailed operation in the upper section memory region in the rewrite operation sequence described in FIG. 12.
Figure 14:
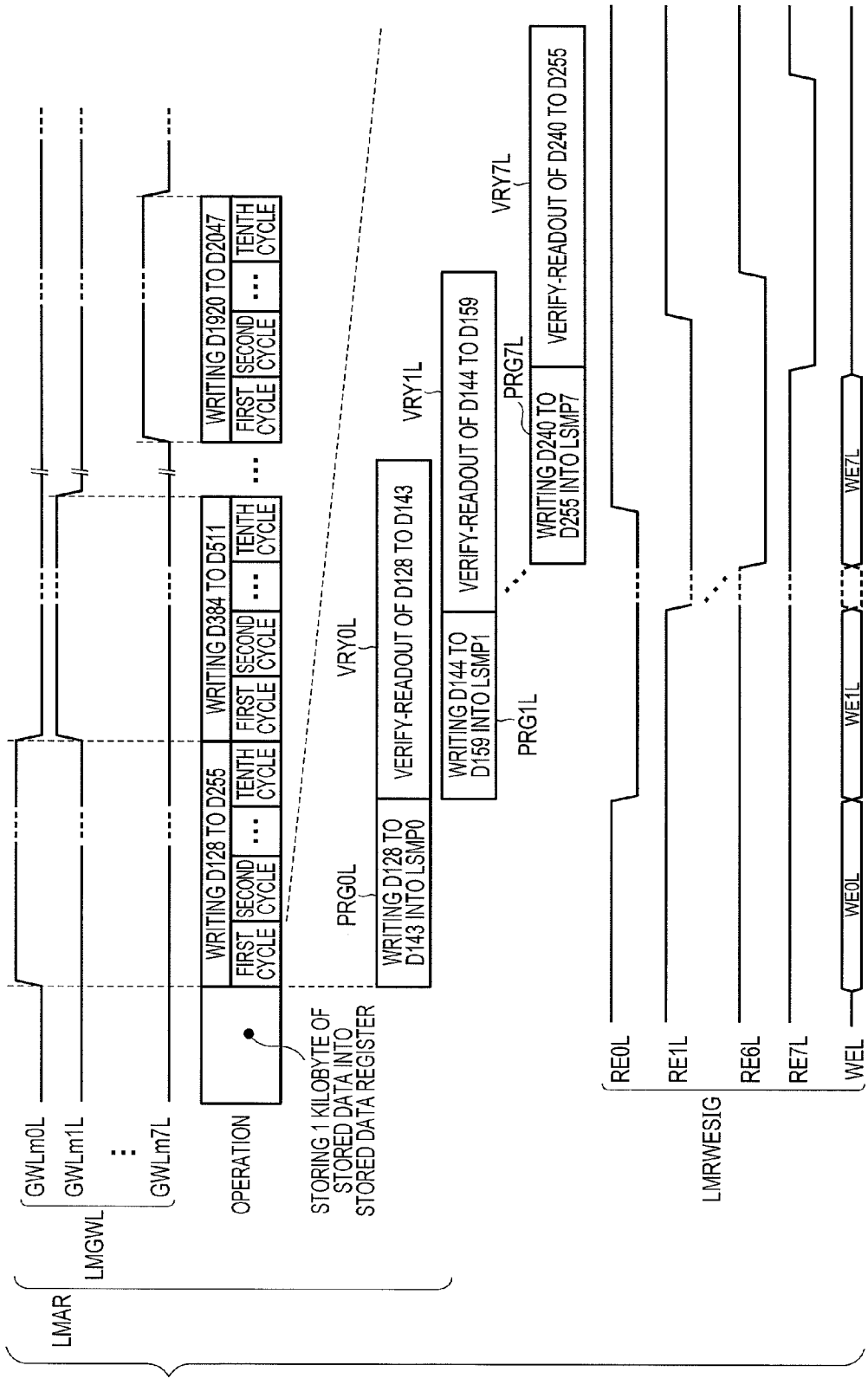
FIG. 14 is a drawing showing one example of the detailed operation in the lower section memory region in the rewrite operation sequence described in FIG. 13.

FIG. 12 is a timing chart showing one example of the phase relation between the verify read and the rewrite operation in the rewrite operation sequence on the phase-change memory chip in the second embodiment of the present invention. FIG. 13 is a timing chart showing one example of the detailed operation in the upper section memory region in the rewrite operation sequence described in FIG. 12. FIG. 14 is a drawing showing one example of the detailed operation in the lower section memory region in the rewrite operation sequence described in FIG. 13.

Brief Overview of the Invention

A second embodiment of the present invention comprises a first and a second memory region (upper section memory region UMAR, lower section memory region LMAR). The first memory region includes a first and a second memory plane (sub-plane USMP0, sub-plane USMP1), each containing multiple memory cells arranged in a matrix; and a first and a second block of pairs of sense-latch and write driver (small-scale blocks of pairs of sense-latch and write driver USWM0, USWM1) to read and to write information in the first and the second memory planes; and a first memory region control circuit (UMARCTL in FIG. 1) to respectively generate: a first write enable signal output to the first block of pairs of sense-latch and write driver, a second write enable signal output to the second block of pairs of sense-latch and write driver (write enable signals WE0U, WE1U), a first readout start signal output to the first block of pairs of sense-latch and write driver, and a second readout start signal output to the second block of pairs of sense-latch and write driver (readout start signals RE0U, RE1U) according to the internal address (internal address INADD) that was input, and the read/write control signal (read/write control signal RWSIG).

The second memory region includes a third and a fourth memory plane (sub-planes USMP0, USMP1) containing multiple memory cells arranged in a matrix; and a third and a fourth block of pairs of sense-latch and write driver (small-scale blocks of pairs of sense-latch and write driver USWM0, USWM1) to read and to write information in the third and the fourth memory planes; and a second memory region control circuit (memory region control circuit LMARCTL) to respectively generate: a third write enable signal output to the third block of pairs of sense-latch and write driver, a fourth write enable signal output to the fourth block of pairs of sense-latch and write driver (write enable signals WE0U, WE1U), a third readout start signal output to the third block of pairs of sense-latch and write driver, and a fourth readout start signal output to the fourth block of pairs of sense-latch and write driver (readout start signals RE0L, RE1L) according to the internal address (internal address INADD) that was input, and the read/write control signal (read/write control signal RWSIG).

The first block of pairs of sense-latch and write driver performs the first rewrite operation on the first memory plane by activating of the first write enable signal, and performs the first verify read on the first memory plane by activating the first readout start signal. The second block of pairs of sense-latch and write driver performs the second rewrite operation on the second memory plane by activating of the second rewrite signal, and further, performs the second verify read on the second memory plane by activating of the second readout start signal. The third block of pairs of sense-latch and write driver performs the third rewrite operation on the third memory plane by activating of the third write enable signal and performs the third verify read on the third memory plane by activating of the third readout start signal. The activating of the fourth write enable signal causes performing of the fourth rewrite operation on the fourth memory plane. Still further, the fourth block of pairs of sense-latch and write driver performs the fourth verify read on the fourth memory plane by activating of the fourth readout start signal. The third and the fourth rewrite operations are performed after the first and the second rewrite operations.

The embodiment is described next in detail based on the above described features.

A separate rewrite operation sequence is described in the second embodiment.

A feature of the rewrite operation sequence described here is that time-division is performed in the verify read, along with the time-division rewrite operation. In the rewrite operation sequence shown in FIG. 12 for example, when writing the stored data D0 through D127 in the upper section memory region UMAR, and the stored data D128 through D255 in the lower section memory region LMAR, the operation for writing on the upper section memory region UMAR and writing on the lower section memory region LMAR are performed alternately in the same rewrite operation sequence as shown in FIG. 9.

However the rewrite operation sequence differs in that the verify read VRY0U is performed immediately after the write operation PRG0U when for example writing 16 bytes of the stored data D0 through D15 into the upper section memory region.

To achieve this type of rewrite operation sequence, the readout start signals that are structural elements for the read/write control signal are also set as multiphase signals the same as the write enable signals, in each small-scale sense-latch and write driver.

In other words, in the upper section memory region UMAR, the structural elements for the read/write control signal block UMRWESIG shown in FIG. 13 are comprised of the readout start signals RE0U through RE7U.

Here, the readout start signal RE0U is input to the corresponding small-scale block of pairs of sense-latch and write driver USWM0, the readout start signal RE1U is input to the corresponding small-scale block of pairs of sense-latch and write driver USWM1, the readout start signal RE2U is input to the corresponding small-scale block of pairs of sense-latch and write driver USWM2, and the readout start signal RE3U is input to the corresponding small-scale block of pairs of sense-latch and write driver USWM3.

Further, the readout start signal RE4U is input to the corresponding small-scale block of pairs of sense-latch and write driver USWM4, the readout start signal RE5U is input to the corresponding small-scale block of pairs of sense-latch and write driver USWM5, the readout start signal RE6U is input to the corresponding small-scale block of pairs of sense-latch and write driver USWM6, and the readout start signal RE7U is input to the corresponding small-scale block of pairs of sense-latch and write driver USWM7.

The readout start signal RE0U for example is activated immediately after writing of the stored data D0 through D15 in the sub-plane USMP0 to start the sense-latches SL0 through SLn (n=127) in the small-scale block of pairs of sense-latch and write driver USWM0 so that the information stored in the selected memory cell in the immediately prior write operation in the sub-plane USMP0 is readout.

Then, a comparator within the sense-latches SL0 through SLn (n=127) compares this readout information with the information temporarily stored in the z byte register UZBR0 of the small-scale stored data register block USDR0 in the stored data register block USDRBK and decides if the desired information was correctly written or not.

In the lower section memory region LMAR in the same way, the structural elements for the read/write control signal LMRWESIG are comprised of the readout start signals RE0L through RE7L as shown in FIG. 14.

Here, the readout start signal RE0L is input to the corresponding small-scale block of pairs of sense-latch and write driver LSWM0, the readout start signal RE1L is input to the corresponding small-scale block of pairs of sense-latch and write driver LSWM1, the readout start signal RE2L is input to corresponding the small-scale block of pairs of sense-latch and write driver LSWM2, and the readout start signal RE3L is input to the corresponding small-scale block of pairs of sense-latch and write driver LSWM3.

Also, the readout start signal RE4L is input to the corresponding small-scale block of pairs of sense-latch and write driver LSWM4, the readout start signal RE5L is input to the corresponding small-scale block of pairs of sense-latch and write driver LSWM5, the readout start signal RE6L is input to the corresponding small-scale block of pairs of sense-latch and write driver LSWM6, and the readout start signal RE7L is input to the corresponding small-scale block of pairs of sense-latch and write driver LSWM7.

The readout start signal RE0L for example is activated immediately after writing of the stored data D128 through D143 in the sub-plane LSMP0 to start the sense-latches SL0 through SLn (n=127) in the small-scale block of pairs of sense-latch and write driver USWM0 so that the information stored in the selected memory cell in the immediately prior write operation in the sub-plane LSMP0 is readout.

A comparator within the sense-latches SL0 through SLn (n=127) then compares this readout information with the information temporarily stored in the z byte register LZBR0 of the small-scale stored data register block LSDR0 in the stored data register block LSDRBK and decides if the desired information was correctly written or not.

In the rewrite operation in the phase-change memory as already described, the state of the storage layer is changed by Joule heat on the chalcogenide material. Therefore, the preheating after rewrite operation might cause a slight change to occur in the resistance due to the material composition and the structure of the storage layer.

However, the structure and operation as described for the present embodiment achieves a uniform interval in all of the memory cell rewrite operations and verify reads so that even if a slight change does occur in the resistance, the pass/fail results for rewrite operation can be judged by the anticipated extent of change to regulate the memory cell resistance to a more uniform value.

The second embodiment can in this way provide a phase-change memory with even higher reliability.

Third Embodiment

Figure 15:
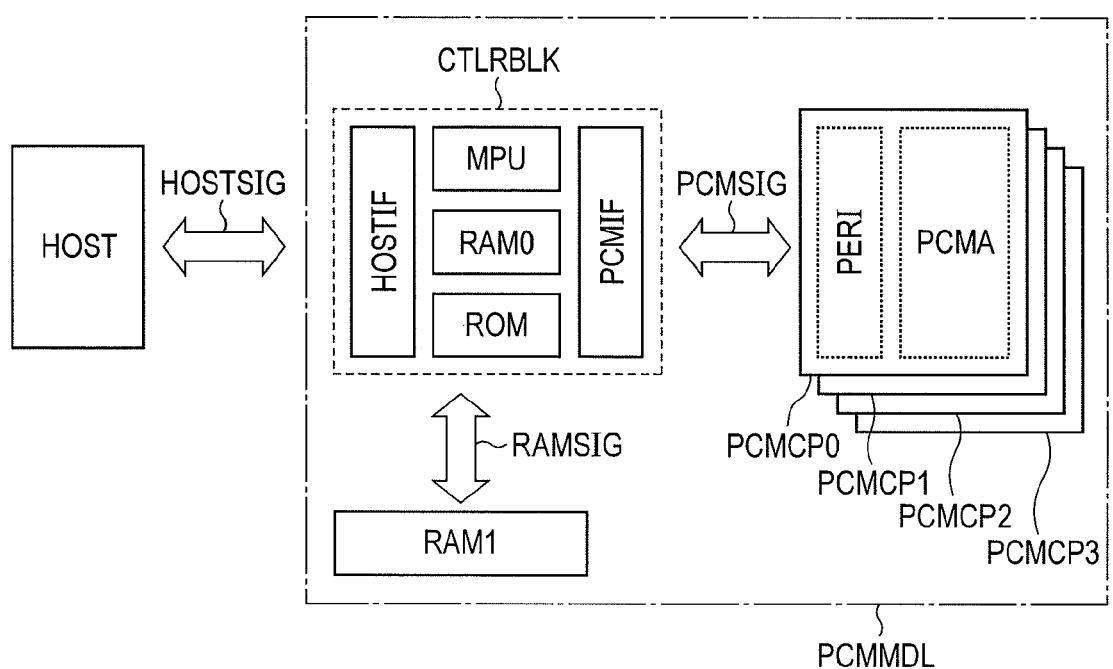
FIG. 15 is a block diagram showing one example of the structure of the semiconductor memory module that utilizes the phase-change memory chip in the third embodiment of the present invention.

FIG. 15 is a block diagram showing one example of the structure of the semiconductor memory module utilizing the phase-change memory chip in the third embodiment of the present invention.

Brief Overview of the Invention

A third embodiment of the invention comprises a semiconductor memory module (semiconductor memory module PCMMDL) comprised of multiple memory chips (phase-change memory chips PCMCP0 through PCMCP3), and a controller chip (controller block CTLRBLK) for controlling the operation of the memory chips.

The memory chips are comprised of a first and a second memory region (upper section memory region UMAR, lower section memory region LMAR). The first memory region includes a first and a second memory plane (sub-plane USMP0, sub-plane USMP1) containing multiple memory cells arranged in a matrix; and a first and a second block of pairs of sense-latch and write driver (small-scale blocks of pairs of sense-latch and write driver USWM0, USWM1) to read and to write information in the first and the second memory planes; and a first memory region control circuit (memory region control circuit UMARCTL) to respectively generate: a first write enable signal output to the first block of pairs of sense-latch and write driver, a second write enable signal output to the second block of pairs of sense-latch and write driver (write enable signals WE0U, WE1U), and a first readout start signal output to the first and the second block of pairs of sense-latch and write driver (readout start signal REU) according to the internal address (internal address INADD) that was input, and the read/write control signal (read/write control signal RWSIG).

Moreover, the second memory region includes a third and a fourth memory plane (sub-planes USMP0, USMP1) containing multiple memory cells arranged in a matrix; and a third and a fourth block of pairs of sense-latch and write driver (small-scale blocks of pairs of sense-latch and write driver USWM0, USWM1) to read and to write information in the third and the fourth memory planes; and a second memory region control circuit (memory region control circuit LMARCTL) to respectively generate: a third write enable signal output to the third block of pairs of sense-latch and write driver, a fourth write enable signal output to the fourth block of pairs of sense-latch and write driver (write enable signals WE0L, WE1L), and a second readout start signal output to the third and the fourth block of pairs of sense-latch and write driver according to the internal address (internal address INADD) that was input, and the read/write control signal (read/write control signal RWSIG).

The third and the fourth write enable signals of the second memory region control circuit are activated, and the third and the fourth block of pairs of sense-latch and write driver perform the first and second rewrite operations (first cycle of write operation PRG0L, PRG1L in the lower section memory region LMAR in FIG. 9) in the second memory region, during the first period when the first readout start signal of the first memory region control circuit is activated, and the first and the second block of pairs of sense-latch and write driver perform the first verify read (verify read VRYU in the first cycle in the upper section memory region UMAR in FIG. 9).

The embodiment is described next in detail based on the above described features.

In the third embodiment, an example of the semiconductor memory module PCMMDL structure in the case of applying the phase-change memory cell arrays described previously in the first and second embodiment is described next while referring to FIG. 15.

The semiconductor memory module PCMMDL is comprised of the phase-change memory chips PCMCP0 through PCMCP3, an externally attached random access memory RAM1, and a controller block CTLRBLK.

Each of the phase-change memory chips PCMCP0 through PCMCP3 are comprised of a phase-change memory array PCMA and peripheral circuit PERI. The phase-change memory array PCMA is for example comprised of the memory regions UMAR, LMAR shown in FIG. 1. The peripheral circuit PERI is comprised of an input/output buffer IOBF and a chip control circuit CPCTL.

The externally attached random access memory RAM1 is a SRAM (static random access memory) or a DRAM (dynamic random access memory).

The controller block CTLRBLK is comprised of a microprocessor unit MPU, a random access memory RAM0, a read-only memory ROM, a phase-change memory interface PCMIF, and a host device interface HOSTIF.

The random access memory RAM0 is a SRAM or a DRAM. The externally attached random access memory RAM1 or the random access memory RAM0 temporarily stores the stored data read out from the phase-change memory chips PCMCP0 through PCMCP3, or information to be newly written into the phase-change memory chips PCMCP0 through PCMCP3.

The read-only memory ROM stores program such as wear leveling and error correction. The microprocessor unit MPU loads these programs and executes wear leveling.

Each unit within the controller block CTLRBLK is coupled from the phase-change memory interface PCMIF to the phase-change memory chips PCMCP0 through PCMCP3 by way of the phase-change memory signal line block PCMSIG.

The controller block CTLRBLK is coupled to the externally attached random access memory RAM1 by way of the RAM signal line block RAMSIG. The controller block CTLRBLK is also coupled to the host device HOST from the host device interface HOSTIF by way of the host device signal line block HOSTSIG.

The controller block CTLRBLK issues commands and outputs them to the phase-change memory interface PCMIF and adjusts the data transfer timing to the phase-change memory chips PCMCP0 through PCMCP3 based on commands transferred from the host device HOST.

The above structure and functions achieve a large (storage) capacity and high-reliability module.

The present invention is not limited to the above described embodiments and all manner of adaptations and changes not departing from the spirit and scope of the present invention are permissible.

The present invention for example is not limited to a single memory chip and may also utilize an on-chip memory. Moreover, the principle of the present invention assumed that the storage elements in the phase change memory utilize chalcogenide material. However, the storage element material is not limited to this (chalcogenide), nor is the invention limited to a phase-change memory and all manner of semiconductor memories not requiring block erasure, such as magneto-resistive random access memories or resistive memories, may be utilized.

The present invention is ideal as a data rewriting technology for phase-change memories.

The invention claimed is:

1. A semiconductor storage apparatus comprising:
a first memory region; and
a second memory region,
wherein the first memory region includes:
a first and a second memory plane, each memory plane including a plurality of memory cells arranged in a matrix;
a first and a second block of pairs of sense-latch and write drivers to read and to write information in the first and the second memory planes; and
a first memory region control circuit to respectively generate: a first write enable signal output to the first block of pairs of sense-latch and write driver, a second write enable signal output to the second block of pairs of sense-latch and write driver, and a first readout start signal output to the first and second blocks of pairs of sense-latch and write driver, according to an input internal address and a read/write control signal,
wherein the second memory region includes:
a third and a fourth memory plane, each memory plane including a plurality of memory cells arranged in a matrix;
a third and a fourth block of pairs of sense-latch and write driver to read and to write information in the third and the fourth memory planes; and
a second memory region control circuit to respectively generate: a third write enable signal output to the third block of pairs of sense-latch and write driver, a fourth write enable signal output to the fourth block of pairs of sense-latch and write driver, and a second readout start signal output to the third and fourth blocks of pairs of sense-latch and write driver, according to the input internal address, and the read/write control signal, and
wherein the first readout start signal in the first memory region control circuit is activated, the third and fourth write enable signals in the second memory region control circuit are activated, and the third and fourth blocks of pairs of sense-latch and write driver perform first and second rewrite operations in the second memory region in a first period in which the first and second blocks of pairs of sense-latch and write driver are performing a first verify read in the first memory region.

2. The semiconductor storage apparatus according to claim 1,
wherein the first and second write enable signals are activated following the first period, the second readout start signal is activated, and a second verify read is performed in the second memory region in a second period in which third and fourth rewrite operations are performed in the first memory region.

3. The semiconductor storage apparatus according to claim 1,
wherein the memory cells include storage layers utilizing chalcogenide material as storage elements.

4. The semiconductor storage apparatus according to claim 3,
wherein the memory cells further include diodes as selection elements.

5. A semiconductor storage apparatus comprising:
a first memory region; and
a second memory region,
wherein the first memory region includes:
a first and a second memory plane, each memory plane including a plurality of memory cells arranged in a matrix;
a first and a second block of pairs of sense-latch and write driver to read and to write information in the first and the second memory planes; and
a first memory region control circuit to respectively generate: a first write enable signal output to the first block of pairs of sense-latch and write driver, a second write enable signal output to the second block of pairs of sense-latch and write driver, a first readout start signal output to the first block of pairs of sense-latch and write driver, and a second readout start signal output to the second block of pairs of sense-latch and write driver, according to an input internal address and a read/write control signal,
wherein the second memory region includes:
a third and a fourth memory plane, each memory plane including a plurality of memory cells arranged in a matrix;
a third and a fourth block of pairs of sense-latch and write driver to read and to write information in the third and the fourth memory planes; and
a second memory region control circuit to respectively generate: a third write enable signal output to the third block of pairs of sense-latch and write driver, a fourth write enable signal output to the fourth block of pairs of sense-latch and write driver, a third readout start signal output to the third block of pairs of sense-latch and write driver, and a fourth readout start signal output to the fourth block of pairs of sense-latch and write driver, according to the input internal address and the read/write control signal,
wherein the first block of pairs of sense-latch and write driver performs a first rewrite operation on the first memory plane by activation of the first write enable signal, and performs a first verify read on the first memory plane by activation of the first readout start signal,
wherein the second block of pairs of sense-latch and write driver performs a second rewrite operation on the second memory plane by activation of the second write enable signal, and performs a second verify read on the second memory plane by activation of the second readout start signal,
wherein the third block of pairs of sense-latch and write driver performs a third rewrite operation on the third memory plane by activation of the third write enable signal, performs a third verify read by activation of the third readout start signal, and performs a fourth rewrite operation on the fourth memory plane by activation of the fourth write enable signal,
wherein the fourth block of pairs of sense-latch and write driver performs a fourth verify read on the fourth memory plane by activation of the fourth readout start signal, and
wherein the third and fourth rewrite operations are performed after the first and second rewrite operations.

6. The semiconductor storage apparatus according to claim 5,
wherein the first and second rewrite operations in the first memory region, and the third and fourth rewrite operations in the second memory region are repeatedly performed alternating with each other.

7. The semiconductor storage apparatus according to claim 5,
wherein the memory cells include storage layers utilizing chalcogenide material as storage elements.

8. A semiconductor memory module comprising a plurality of memory chips, and a controller chip to control the operation of the memory chips,
wherein each memory chip includes a first and a second memory region,
wherein the first memory region includes:
a first and a second memory plane, each memory plane including a plurality of memory cells arranged in a matrix;
a first and a second block of pairs of sense-latch and write driver to read and to write information in the first and second memory planes; and
a first memory region control circuit to respectively generate: a first write enable signal output to the first block of pairs of sense-latch and write driver, a second write enable signal output to the second block of pairs of sense-latch and write driver, and a first readout start signal output to the first and second blocks of pairs of sense-latch and write driver, according to an input internal address and a read/write control signal, and
wherein the second memory region includes:
a third and a fourth memory plane, each memory plane including a plurality of cells arranged in a matrix;
a third and a fourth block of pairs of sense-latch and write driver to read and to write information in the third and the fourth memory planes; and
a second memory region control circuit to respectively generate: a third write enable signal output to the third block of pairs of sense-latch and write driver, a fourth write enable signal output to the fourth block of pairs of sense-latch and write driver, and a second readout start signal output to the third and fourth blocks of sense-latch and write driver, according to the input internal address, and the read/write control signal, and
wherein the first readout start signal in the first memory region control circuit is activated, the third and fourth write enable signals in the second memory region control circuit are activated, and the third and fourth blocks of pairs of sense-latch and write driver perform a first and a second rewrite operation in the second memory region, in a first period in which the first and second blocks of pairs of sense-latch and write driver are performing a first verify read in the first memory region.

9. The semiconductor memory module according to claim 8, wherein the first and second write enable signals are activated following the first period, the second readout start signal is activated, and the third and the fourth blocks of pairs of sense-latch and write driver perform a second verify read in the second memory region, in a second period in which the first and second blocks of pairs of sense-latch and write driver are performing third and fourth rewrite operations in the first memory region.

10. The semiconductor memory module according to claim 8, wherein the memory cells include storage layers utilizing chalcogenide material as storage elements.

* * * * *